(12) United States Patent
Lee et al.

(10) Patent No.: US 11,810,623 B2
(45) Date of Patent: Nov. 7, 2023

(54) SEMICONDUCTOR MEMORY DEVICE, CONTROLLER, AND OPERATING METHOD THEREOF

(71) Applicant: SK hynix Inc., Icheon-si (KR)

(72) Inventors: Un Sang Lee, Icheon-si (KR); Moon Sik Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 168 days.

(21) Appl. No.: 17/395,166

(22) Filed: Aug. 5, 2021

(65) Prior Publication Data

US 2022/0262442 A1 Aug. 18, 2022

(30) Foreign Application Priority Data

Feb. 18, 2021 (KR) .................... 10-2021-0022127

(51) Int. Cl.
*G11C 7/00* (2006.01)
*G11C 16/26* (2006.01)
*G11C 5/02* (2006.01)
*G11C 16/04* (2006.01)
*G06F 12/02* (2006.01)
*G11C 5/06* (2006.01)

(52) U.S. Cl.
CPC .......... *G11C 16/26* (2013.01); *G06F 12/0246* (2013.01); *G11C 5/025* (2013.01); *G11C 5/06* (2013.01); *G11C 16/0483* (2013.01)

(58) Field of Classification Search
CPC ....... G11C 7/1078; G11C 7/22; G11C 7/1072; G11C 7/1096
USPC .......................... 365/189.16, 189.14, 185.18
See application file for complete search history.

(56) References Cited

U.S. PATENT DOCUMENTS

| 8,929,170 | B2* | 1/2015 | Park | G11C 8/04 365/194 |
| 10,832,782 | B2* | 11/2020 | Park | G11C 16/3459 |
| 2012/0324177 | A1* | 12/2012 | Shin | H04L 69/12 711/E12.001 |

FOREIGN PATENT DOCUMENTS

| KR | 101642930 B1 | 7/2016 |
| KR | 1020200014134 A | 2/2020 |

* cited by examiner

*Primary Examiner* — Son T Dinh
(74) *Attorney, Agent, or Firm* — WILLIAM PARK & ASSOCIATES LTD.

(57) ABSTRACT

Disclosed is an operating method of a controller for controlling an operation of a semiconductor memory device including a plurality of memory cells. In the operating method of the controller, program data to be stored in a selected page of the semiconductor memory device is generated, and the semiconductor memory device is controlled to program the program data in the selected page. Bit data at a predetermined position in the program data is data for allowing a threshold voltage of a corresponding memory cell to maintain an erase state.

18 Claims, 25 Drawing Sheets

SEMICONDUCTOR MEMORY DEVICE, CONTROLLER, AND OPERATING METHOD THEREOF

CROSS-REFERENCE TO RELATED APPLICATION

The present application claims priority under 35 U.S.C. § 119(a) to Korean patent application number 10-2021-0022127 filed on Feb. 18, 2021, in the Korean Intellectual Property Office, the entire disclosure of which is incorporated by reference herein.

BACKGROUND

1. Technical Field

The present disclosure generally relates to an electronic device, and more particularly, to a semiconductor memory device, a controller, and an operating method thereof.

2. Related Art

A semiconductor memory device may be formed in a two-dimensional structure in which strings are arranged parallel to a semiconductor substrate, or be formed in a three-dimensional structure in which strings are arranged perpendicular to a semiconductor substrate. A three-dimensional memory device, for example, is a semiconductor memory device devised to overcome the limit of the degree of integration in two-dimensional semiconductor memory devices, and may include a plurality of memory cells vertically stacked above a semiconductor substrate. Meanwhile, a controller may control an operation of the semiconductor memory device.

SUMMARY

Some embodiments are directed to a semiconductor memory device capable of rapidly checking whether a threshold voltage distribution of a memory block in which data is stored has been degraded.

Some embodiments are also directed to a controller capable of rapidly checking whether a threshold voltage distribution of a memory block in a semiconductor memory device has been degraded.

In accordance with an embodiment of the present disclosure, there is a method for operating a controller for controlling an operation of a semiconductor memory device including a plurality of memory cells, the method including: generating program data to be stored in a selected page of the semiconductor memory device; and controlling the semiconductor memory device to program the program data in the selected page, wherein bit data at a predetermined position in the program data is data for allowing a threshold voltage of a corresponding memory cell to maintain an erase state.

The program data may be generated from user data received from a host.

The bit data at the predetermined position in the program data may be 1.

The method may further include: transferring, to the semiconductor memory device, a detection read command for a selected memory block including the selected page; receiving read data from the semiconductor memory device; and determining whether bit data at a predetermined position in the read data is 1.

The method may further include determining that a threshold voltage distribution of memory cells included in the selected memory block is satisfactory, in response to a determination that the bit data at the predetermined position in the read data is 1.

The method may further include determining that a threshold voltage distribution of memory cells included in the selected memory block has been degraded, in response to a determination that the bit data at the predetermined position in the read data is 0.

The method may further include moving data stored in the selected memory block to another memory block.

In accordance with another embodiment of the present disclosure, there is a method for operating a semiconductor memory device including a plurality of memory blocks, the method including: receiving a read command from a controller; checking a type of the read command and obtaining a check result; and performing, based on the check result, a read operation corresponding to the read command on a selected memory block among the plurality of memory blocks.

When the type of read command is a normal read command, performing the read operation may include applying a read voltage to a word line connected to a page which becomes a target of the normal read command among a plurality of word lines connected to the selected memory block, and applying a read pass voltage to the other word lines.

When the read command is a detection read command as a result obtained by checking the type of the read command, the performing of the read operation may include applying a read voltage to a plurality of word lines connected to the selected memory block.

The method may further include transferring, to the controller, read data obtained by performing the read operation.

In accordance with still another embodiment of the present disclosure, there is a controller for controlling an operation of a semiconductor memory device including a plurality of memory cells, the controller including: a data converter configured to generate program data to be stored in a selected page of the semiconductor memory device, based on user data; and a command generator configured to generate a program command for controlling the semiconductor memory device to program the program data in the selected page, wherein bit data at a predetermined position in the program data is data for allowing a threshold voltage of a corresponding memory cell to maintain an erase state.

The data converter may include: a randomizer capable of generating temporary data by randomizing the user data; and a data reversal component capable of selectively reversing the temporary data, based on a bit at a predetermined position of the temporary data.

The data reversal component may be capable of, when the bit at the predetermined position of the temporary data is 1, outputting the temporary data as the program data.

The data reversal component may be capable of, when the bit at the predetermined position of the temporary data is 0, reversing the temporary data in units of bits. In addition, the data reversal component may be capable of outputting, when the bit at the predetermined position of the temporary data is 0, the reversed temporary data as the program data.

The data converter may include: a randomizer capable of generating temporary data by randomizing the user data; and a dummy bit insertion component capable of inserting a dummy bit at a predetermined position of the temporary data.

The dummy bit insertion component may be capable of inserting a bit of 1 at the predetermined position of the temporary data.

The command generator may transfer, to the semiconductor memory device, a detection read command for a selected memory block including the selected page.

The controller may be configured to determine whether a threshold voltage distribution of memory cells included in the selected memory block has been degraded, based on read data received corresponding to the detection read command.

The controller may be configured to determine, when bit data at a predetermined position of the read data is 0, that the threshold voltage distribution of the memory cells included in the selected memory block is satisfactory. The controller may be configured to determine, when the bit data at the predetermined position of the read data is 1, that the threshold voltage distribution of the memory cells included in the selected memory block has been degraded.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the drawings.

DETAILED DESCRIPTION

The specific structural and functional descriptions disclosed herein are merely illustrative for the purpose of describing embodiments according to the concept of the present disclosure. Embodiments according to the concept of the present disclosure can be implemented in various forms, and should not be construed as being limited to just the embodiments set forth herein.

Figure 1:
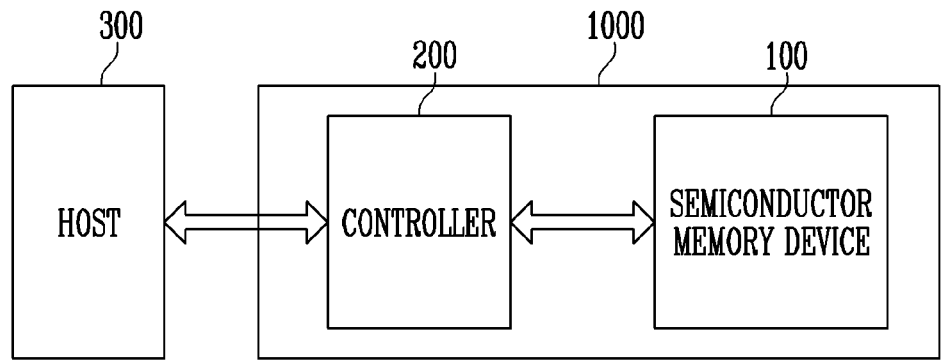
FIG. 1 is a block diagram illustrating a memory system including a semiconductor memory device and a controller in accordance with an embodiment of the present disclosure.

FIG. 1 is a block diagram illustrating a memory system 1000 including a semiconductor memory device 100 and a controller 200 in accordance with an embodiment of the present disclosure.

Referring to FIG. 1, the memory system 1000 includes the semiconductor memory device 100 and a controller 200. Also, the memory system 1000 communicates with a host 300. The controller 200 controls overall operations of the semiconductor memory device 100. Also, the controller 200 controls an operation of the semiconductor memory device 100, based on a command received from the host 300.

Figure 2:
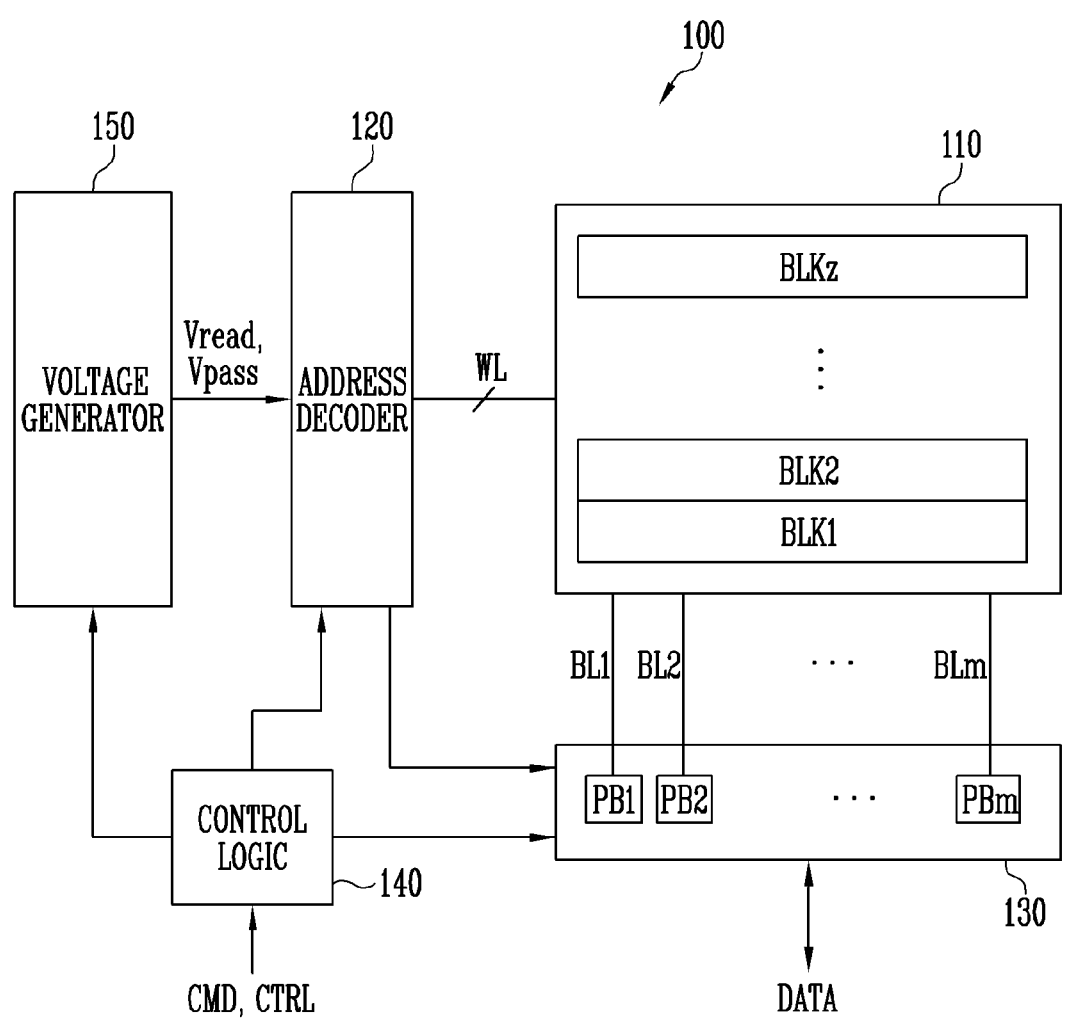
FIG. 2 is a block diagram illustrating the semiconductor memory device shown in FIG. 1.

FIG. 2 is a block diagram illustrating the semiconductor memory device 100 shown in FIG. 1.

Referring to FIG. 2, the semiconductor memory device 100 may include a memory cell array 110, an address decoder 120, a read/write circuit 130, control logic 140, and a voltage generator 150.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read/write circuit 130 through bit lines BL1 to BLm. Each of the plurality of memory blocks BLK1 to BLKz includes a plurality of memory cells. In an embodiment, the plurality of memory cells may be nonvolatile memory cells, and be configured as nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Meanwhile, each of the plurality of memory cells included in the memory cell array 110 may store at least 1-bit data. In an embodiment, each of plurality of the memory cells included in the memory cell array 110 may be a single-level cell (SLC) storing 1-bit data. In another embodiment, each of the plurality of memory cells included in the memory cell array 110 may be a multi-level cell (MLC) storing 2-bit data. In still another embodiment, each of the plurality of memory cells included in the memory cell array 110 may be a triple-level cell (TLC) storing 3-bit data. In still another embodiment, each of the plurality of memory cells included in the memory cell array 110 may be a quadruple-level cell (QLC) storing 4-bit data. In some embodiments, the memory cell array 110 may include a plurality of memory cells each storing 5-or-more bit data.

The address decoder 120, the read/write circuit 130, and the voltage generator 150 operate as a peripheral circuit for driving the memory cell array 110. The address decoder 120 is connected to the memory cell array 110 through the word lines WL. The address decoder 120 operates under the control of the control logic 140. The address decoder 120 receives an address through an input/output buffer (not shown) in the semiconductor memory device 100.

The address decoder 120 decodes a block address in the received address. The address decoder 120 selects at least one memory block according to the decoded block address. Also, in a read voltage application operation during a read operation, the address decoder 120 applies a read voltage Vread generated by the voltage generator 150 to a selected word line of the selected memory block, and applies a pass voltage Vpass generated by the voltage generator 150 to the other unselected word lines. Also, in a program verify operation, the address decoder 120 applies a verify voltage generated by the voltage generator 150 to the selected word line of the selected memory block, and applies the pass voltage Vpass to the other unselected word lines.

The address decoder 120 decodes a column address in the received addresses. The address decoder 120 transmits the decoded column address to the read/write circuit 130.

Read and program operations of the semiconductor memory device 100 are performed in units of pages. An address received in response to a request for read and program operations includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation, and operate as a "write circuit" in a write operation. The plurality of page buffers PB1 to PBm are connected to the memory cell array 110 through the bit lines BL1 to BLm. In order to sense a threshold voltage of memory cells in a read operation or a program verify operation, the plurality of page buffers PB1 to PBm latch sensing data by sensing, through a sensing node, a change in amount of current flowing according to a program state of a corresponding memory cell while continuously supplying a sensing current to bit lines connected to the memory cells. The read/write circuit 130 operates in response to page buffer control signals output from the control logic 140.

In a read operation, the read/write circuit 130 senses data of a memory cell, temporarily stores the data, and then outputs data DATA as read data to the input/output buffer (not shown) of the semiconductor memory device 100. In an embodiment, the read/write circuit 130 may include a column select circuit and the like in addition to the page buffers (or page registers).

The control logic 140 is connected to the address decoder 120, the read/write circuit 130, and the voltage generator 150. The control logic 140 receives a command CMD and a control signal CTRL though the input/output buffer (not shown) of the semiconductor memory device 100. The control logic 140 controls a general operation of the semiconductor memory device 100 in response to the control signal CTRL. Also, the control logic 140 outputs a control signal for adjusting a sensing node precharge potential level of the plurality of page buffers PB1 to PBm. The control logic 140 may control the read/write circuit 130 to perform a read operation of the memory cell array 110. The control logic 140 may be implemented as hardware, software, or a combination of hardware and software. For example, the control logic 140 may be a control logic circuit operating in accordance with an algorithm and/or a processor executing control logic code.

The voltage generator 150 generates a read voltage Vread and a pass voltage Vpass in a read operation in response to a control signal output from the control logic 140. In order to generate a plurality of voltages having various voltage levels, the voltage generator 150 may include a plurality of pumping capacitors for receiving an internal power voltage, and generate the plurality of voltages by selectively activating the plurality of pumping capacitors under the control of the control logic 140. As described above, the voltage generator 150 may include a charge pump, and the charge pump may include the plurality of pumping capacitors. A configuration of the charge pump included in the voltage generator 150 may be variously designed.

The address decoder 120, the read/write circuit 130, and the voltage generator 150 may serve as a "peripheral circuit" for performing a read operation, a write operation, and an erase operation on the memory cell array 110. The peripheral circuit performs the read operation, the write operation, and the erase operation on the memory cell array 110 under the control of the control logic 140.

Figure 3:
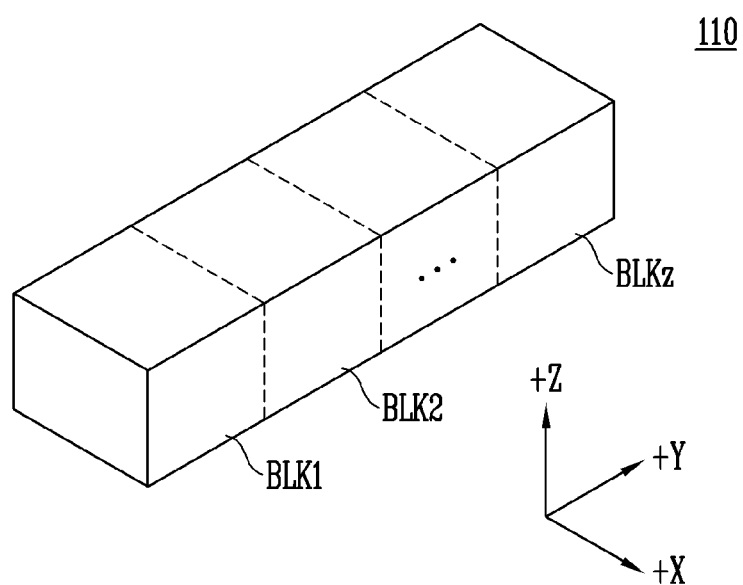
FIG. 3 is a diagram illustrating an embodiment of a memory cell array shown in FIG. 2.

FIG. 3 is a diagram illustrating an embodiment of the memory cell array 110 shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
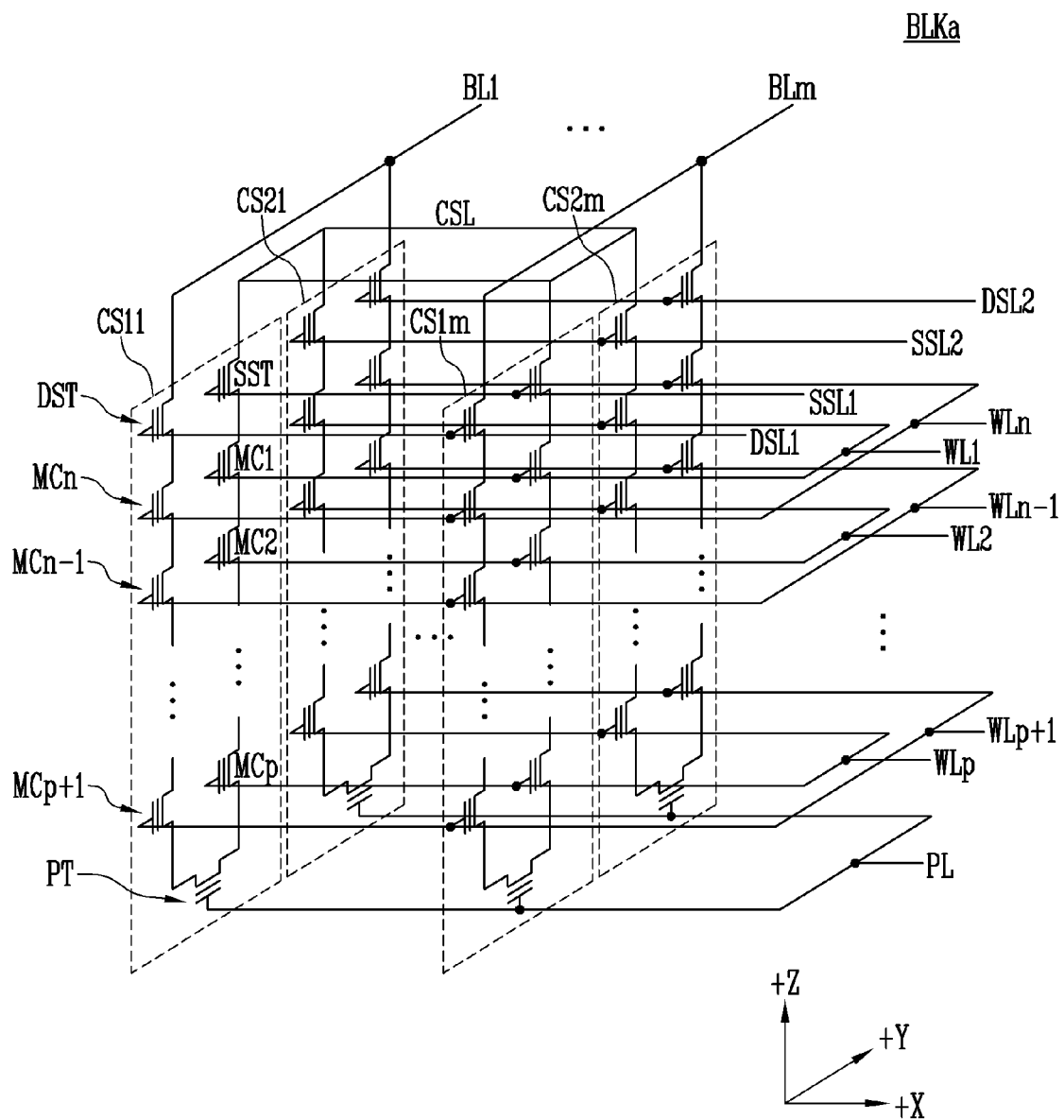
FIG. 4 is a circuit diagram illustrating any one memory block among memory blocks shown in FIG. 3.

FIG. 4 is a circuit diagram illustrating any one memory block BLKa among the memory blocks BLK1 to BLKz shown in FIG. 3.

Referring to FIG. 4, a memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). Although a case of two cell strings arranged in a column direction (i.e., a +Y direction) is illustrated in FIG. 4, this is for convenience of description, and it will be understood that three or more cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp.

In an embodiment, the source select transistors of cell strings arranged on the same row are connected to a source select line extending in the row direction, and the source select transistors of cell strings arranged on different rows are connected to different source select lines. In FIG. 4, the source select transistors of the cell strings CS11 to CS1m on a first row are connected to a first source select line SSL1. The source select transistors of the cell strings CS21 to CS2m on a second row are connected to a second source select line SSL2.

In another embodiment, the source select transistors of the cell strings CS11 to CS1m and CS21 to CS2m may be commonly connected to one source select line.

The first to nth memory cells MC1 to MCn of each cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. Cell strings arranged in the row direction are connected to a drain select line extending in the row direction. The drain select transistors of the cell strings CS11 to CS1m on the first row are connected to a first drain select line DSL1. The drain select transistors of the cell strings CS21 to CS2m on the second row are connected to a second drain select line DSL2.

Cell strings arranged in the column direction are connected to a bit line extending in the column direction. In FIG. 4, the cell strings CS11 and CS21 on a first column are connected to a first bit line BL1. The cell strings CS1m and CS2m on an mth column are connected to an mth bit line BLm.

Memory cells connected to the same word line in the cell strings arranged in the row direction constitute one page. For example, memory cells connected to the first word line WL1 in the cell strings CS11 to CS1m on the first row constitute one page. Memory cells connected to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be diminished.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, through controlling a voltage applied to the dummy word lines connected to the respective dummy memory cells, the dummy memory cells can have the required threshold voltage.

Figure 5:
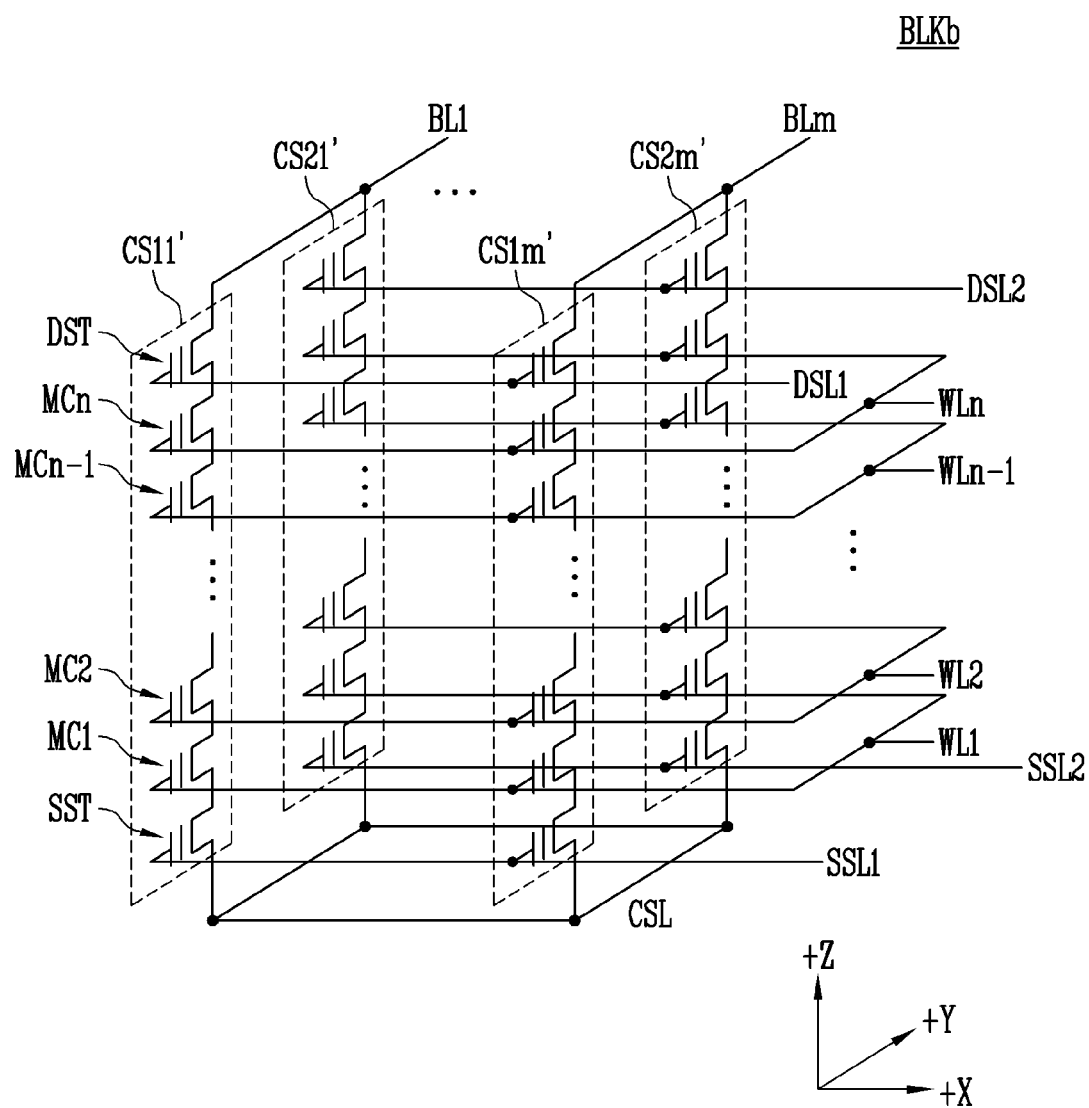
FIG. 5 is a circuit diagram illustrating another embodiment of the one memory block among the memory blocks shown in FIG. 3.

FIG. 5 is a circuit diagram illustrating another embodiment BLKb of the one memory block among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line SSL1. Source select transistors of the cell strings CS21' to CS2m' arranged on a second row are connected to a second source select line SSL2. In another embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be diminished.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, through controlling a voltage applied to the dummy word lines connected to the respective dummy memory cells, the dummy memory cells can have the required threshold voltage.

Figure 6:
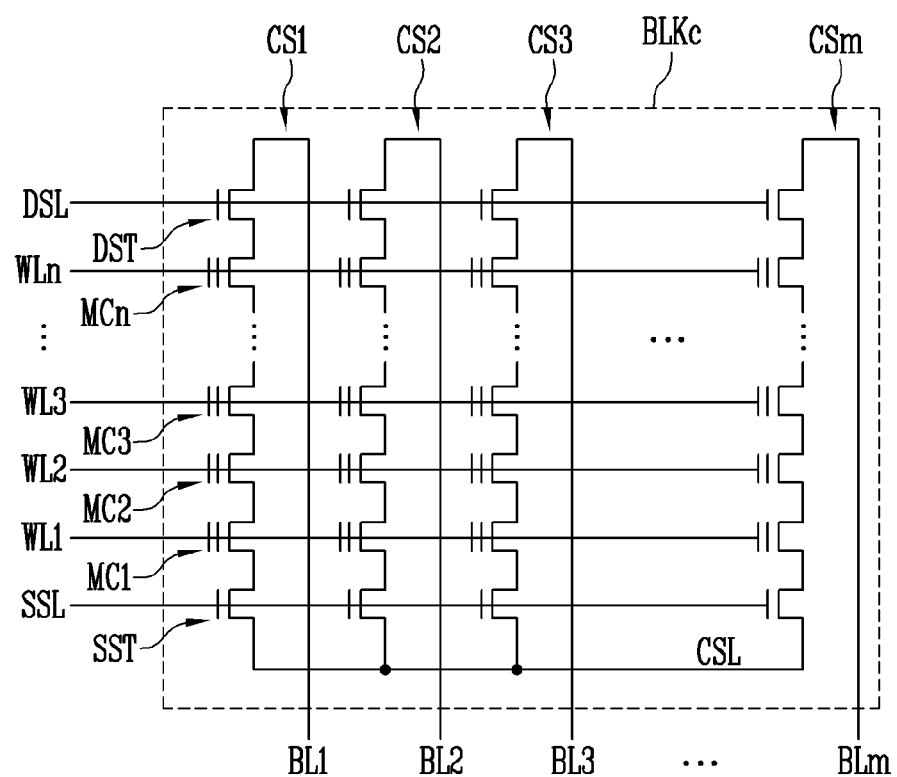
FIG. 6 is a circuit diagram illustrating an embodiment of any one memory block among a plurality of memory blocks included in the memory cell array shown in FIG. 2.

FIG. 6 is a circuit diagram illustrating an embodiment of any one memory block BLKc among the plurality of memory blocks BLK1 to BLKz included in the memory cell array 110 shown in FIG. 2.

Referring to FIG. 6, the memory block BLKc includes a plurality of strings CS1 to CSm. The plurality of strings CS1 to CSm may be connected to a plurality of bit lines BL1 to BLm, respectively. Each of the plurality of strings CS1 to CSm includes at least one source select transistor SST, first to nth memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and the memory cells MC1 to MCn.

The first to nth memory cells MC1 to MCn of each cell string is connected between the source select transistor SST and the drain select transistor DST.

The drain select transistor DST of each cell string is connected between a corresponding bit line and the memory cells MC1 to MCn.

Memory cells connected to the same word line constitute one page. As a drain select line DSL is selected, the cell strings CS1 to CSm may be selected. As any one of word lines WL1 to WLn is selected, one page among selected cell strings may be selected.

In another embodiment, even bit lines and odd bit lines may be provided instead of the first to mth bit lines BL1 to BLm. Even-numbered cell strings among the cell strings CS1 to CSm arranged may be connected to the even bit lines, respectively, and odd-numbered cell strings among the cell strings CS1 to CSm may be connected to the odd bit lines, respectively.

Figure 7:
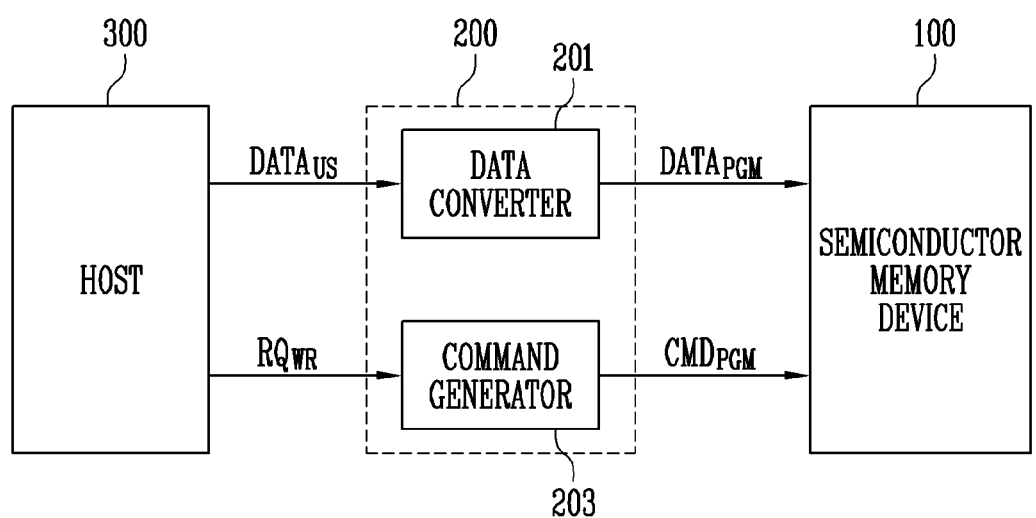
FIG. 7 is a block diagram illustrating a controller in accordance with an embodiment of the present disclosure.

FIG. 7 is a block diagram illustrating a controller 200 in accordance with an embodiment of the present disclosure. Referring to FIG. 7, the controller includes a data converter 201 and a command generator 203.

Figure 8:
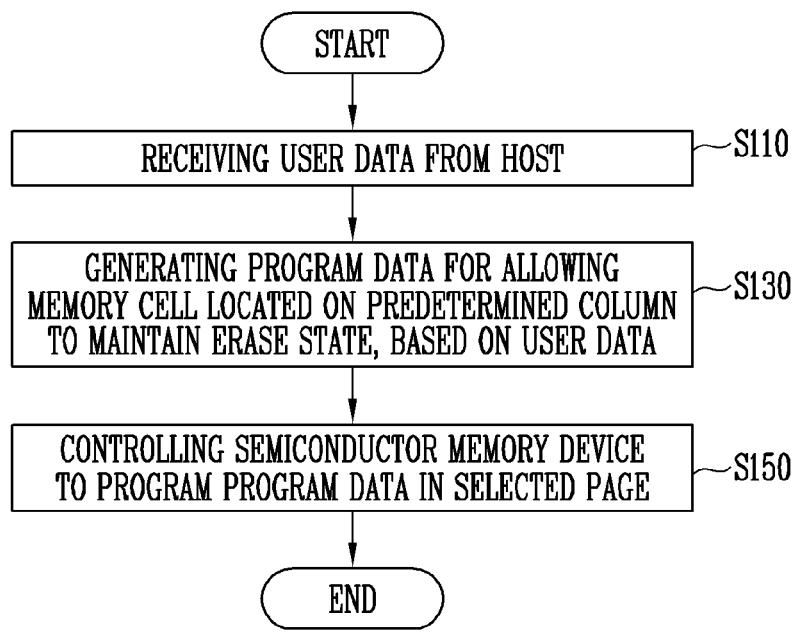
FIG. 8 is a flowchart illustrating an operating method of the controller in accordance with an embodiment of the present disclosure.

FIG. 8 is a flowchart illustrating an operating method of the controller 200 in accordance with an embodiment of the present disclosure. Referring to FIG. 8, the operating method of the controller 200 includes step S110 of receiving user data $DATA_{US}$ from the host 300, step S130 of generating program data $DATA_{PGM}$ for allowing a memory cell located on a predetermined column to maintain an erase state, based on the user data $DATA_{US}$, and step S150 of controlling the semiconductor memory device 100 to program the program data $DATA_{PGM}$ in a selected page. Hereinafter, the controller 200 and the operating method thereof will be described with reference to FIGS. 7 and 8 together.

First, the data converter 201 of the controller 200 may receive user data $DATA_{US}$ from the host 300 (S110). Referring to FIG. 7, the data converter 201 may generate program data $DATA_{PGM}$ by converting the user data $DATA_{US}$ received from the host 300 (S130). The program data $DATA_{PGM}$ generated in this process is data for allowing a memory cell located on a predetermined column to maintain an erase state. The generated program data $DATA_{PGM}$ may be transferred to the semiconductor memory device 100.

Meanwhile, the command generator 203 may receive a write request $RQ_{WR}$ from the host 300. The write request $RQ_{WR}$ may correspond to the user data $DATA_{US}$. The command generator 203 may generate a program command $CMD_{PGM}$ for controlling the semiconductor memory device 100 to program program data $DATA_{PGM}$ at a specific position, in response to the write request $RQ_{WR}$.

That is, the controller 200 transfers the program data $DATA_{PGM}$ and the program command $CMD_{PGM}$ to the semiconductor memory device 100. Accordingly, the controller 200 may control the semiconductor memory device 100 to program the program data $DATA_{PGM}$ in a selected page (S150).

The semiconductor memory device 100 may program the received program data $DATA_{PGM}$, based on the received program command $CMD_{PGM}$. The semiconductor memory device 100 may program the program data $DATA_{PGM}$ at a position specified by an address received from the controller 200.

The controller 200 may generate the program data DATAPGM by converting the user data DATAUS received from the host 300. The controller 200 may generate the program data DATAPGM for allowing the memory cell located on the predetermined column in a memory block, which becomes a program target, to maintain an erase state.

Referring to FIGS. 7 and 8, an embodiment in which the program data $DATA_{PGM}$ is generated based on the user data $DATA_{US}$ received from the host is illustrated, but the present disclosure is not limited thereto. For example, in a program operation performed as a portion of a garbage collection operation, data stored in a victim block of the semiconductor memory device 100 may be read, and the read data may be again programmed in a target block of the semiconductor memory device 100. The program data $DATA_{PGM}$ may be generated based on the data read from the victim block instead of the user data $DATA_{US}$ received from the host. Instead of the step S110 shown in FIG. 8, step of receiving the data read from the victim block of the semiconductor memory device 100 may be performed. In the step S130, the program data $DATA_{PGM}$ for allowing the memory cell located on the predetermined column to maintain the erase state may be generated, based on the data read from the victim block.

The program data $DATA_{PGM}$ for allowing the memory cell located on the predetermined column to maintain the erase state will be described later with reference to FIGS. 9 to 12B.

Figure 9:
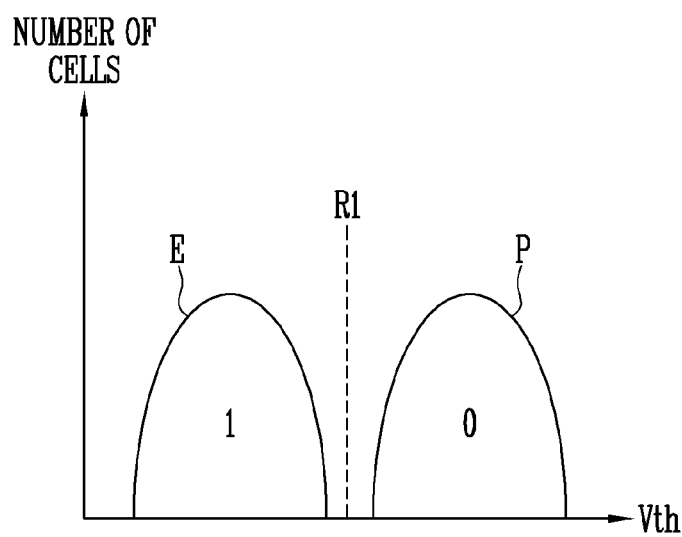
FIG. 9 is a graph illustrating a threshold voltage distribution of Single-Level Cells (SLCs) for which a program operation is completed.

FIG. 9 is a graph illustrating a threshold voltage distribution of Single-Level Cells (SLCs) for which a program operation is completed. In an embodiment of the present disclosure, the memory cells included in the memory cell array 110 shown in FIG. 2 may include SLCs having a threshold voltage distribution shown in FIG. 9. Hereinafter, an operation of the semiconductor memory device and the controller in accordance with the present disclosure will be described with respect to the SLC.

Referring to FIG. 9, a threshold voltage distribution of SLCs storing 1-bit data per memory cell is shown. The SLC has a threshold voltage corresponding to any one of an erase state E and a program state P. A first read voltage R1 may be used to read data stored in the SLC. Meanwhile, the SLC may represent bit data of 1 or 0 according to a threshold voltage state. As an example, an embodiment in which memory cells having a threshold voltage of the erase state E represent bit data of 1 and memory cells having a threshold voltage of the program state P represent bit data of 0 is illustrated in FIG. 9. In accordance with the embodiment shown in FIG. 9, after program data $DATA_{PGM}$ is programmed in a selected page, a memory cell located on a predetermined column of the selected page maintains the erase state. Therefore, bit data of "1" may be stored in the memory cell located on the predetermined column of the selected page.

Figure 10:
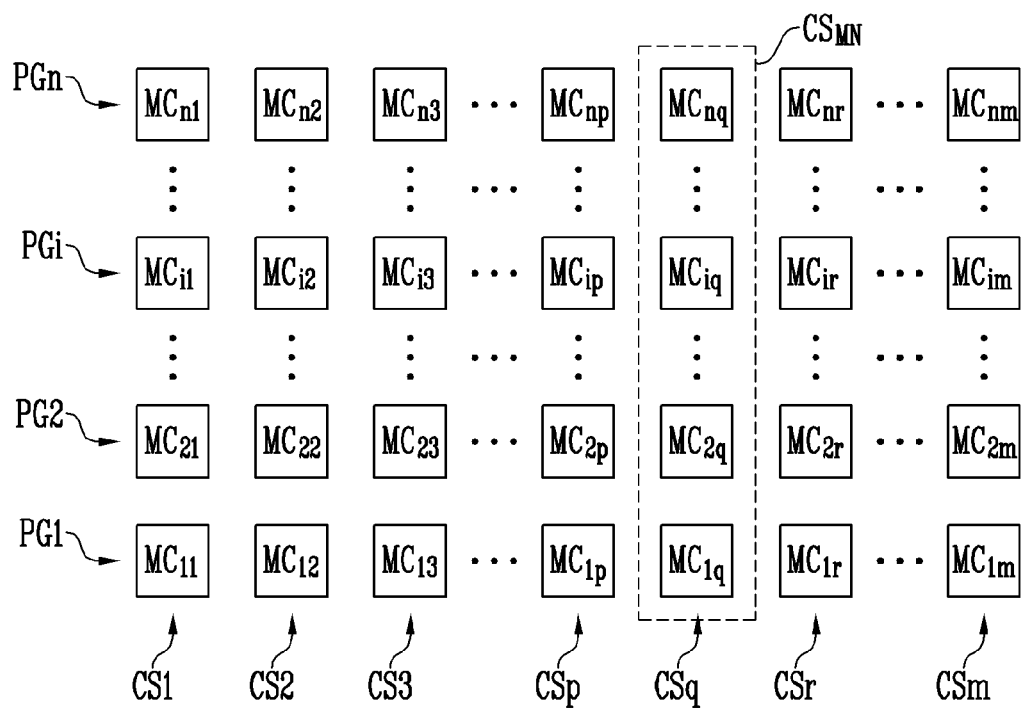
FIG. 10 is a diagram illustrating memory cells in a memory block.

FIG. 10 is a diagram illustrating memory cells in a memory block.

Referring to FIG. 10, the memory block includes first to mth cell strings CS1 to CSm. The first cell string CS1 includes n memory cells $MC_{11}$ to $MC_{n1}$. The second cell string CS2 also includes n memory cells $MC_{12}$ to $MC_{n2}$. In this manner, the mth cell string CSm may include n memory cells $MC_{1m}$ to $MC_{nm}$.

Meanwhile, a first page PG1 includes m memory cells $MC_{11}$ to $MC_{1m}$. A second page PG2 also includes m memory cells $MC_{21}$ to $MC_{2m}$. In this manner, an nth page PGn includes m memory cells $MC_{n1}$ to $MC_{nm}$.

An arbitrary cell string among the m cell strings CS1 to CSm in the memory block may be selected as a monitoring target. In the example shown in FIG. 10, a qth cell string CSq has been selected as a cell string $CS_{MN}$ which becomes the monitoring target. According to the controller and the operating method thereof in accordance with the embodiment of the present disclosure, program data $DATA_{PGM}$ for maintaining memory cells $MC_{1q}$ to $MC_{nq}$ included in the qth cell string CSq is generated. A program operation may be performed in units of pages.

When the program data $DATA_{PGM}$ is data to be programmed in the memory cells $MC_{11}$ to $MC_{1m}$ included in the first page PG1 among the first to nth pages PG1 to PGn, the program data $DATA_{PGM}$ may be data for allowing a memory cell $MC_{1q}$ to maintain the erase state. More generally, when the program data $DATA_{PGM}$ is data to be programmed in the memory cells $MC_{i1}$ to $MC_{im}$ included in an ith page PGi among the first to nth pages PG1 to PGn, the program data $DATA_{PGM}$ may be data for allowing a memory cell $MC_{iq}$ to maintain the erase state.

Therefore, the same bit data may be stored in the memory cells $MC_{1q}$ to $MC_{nq}$ included in the cell string $CS_{MN}$ which becomes the monitoring target.

Figure 11:
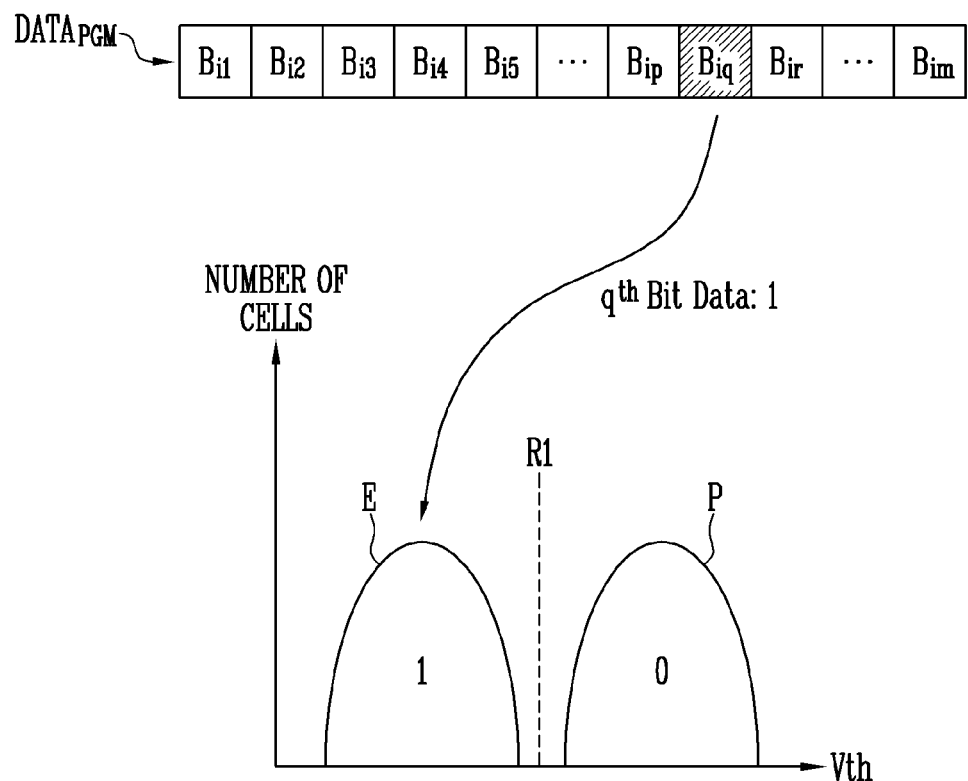
FIG. 11 is a diagram illustrating data programmed in a selected page by using an SLC scheme in accordance with an embodiment of the present disclosure.

FIG. 11 is a diagram illustrating data programmed in a selected page by using an SLC scheme in accordance with an embodiment of the present disclosure.

Referring to FIG. 11, it is assumed that the program data $DATA_{PGM}$ is data to be programmed in the memory cells $MC_{i1}$ to $MC_{im}$ included in the ith page PGi among the first to nth pages PG1 to PGn. The program data $DATA_{PGM}$ may include m bit data $B_{i1}$ to $B_{im}$.

In the example shown in FIG. 11, the predetermined column is a qth column. Therefore, a qth bit data among the bit data $B_{i1}$ to $B_{im}$ included in the program data $DATA_{PGM}$ may be 1. Accordingly, a threshold voltage of a memory cell located on the qth column may maintain the erase state E even after the program operation. In addition to the ith page, qth bit data respectively included in program data programmed in the first to nth page PG1 to PGn are all "1."

Figure 12A:
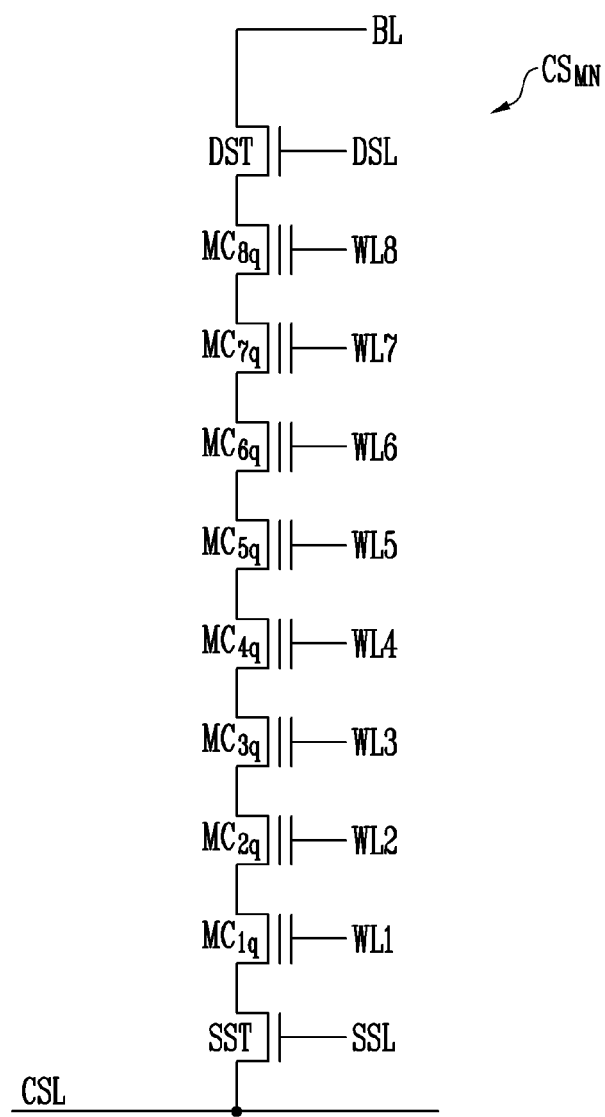
FIG. 12A is a circuit diagram illustrating a cell string which becomes a monitoring target.
Figure 12B:
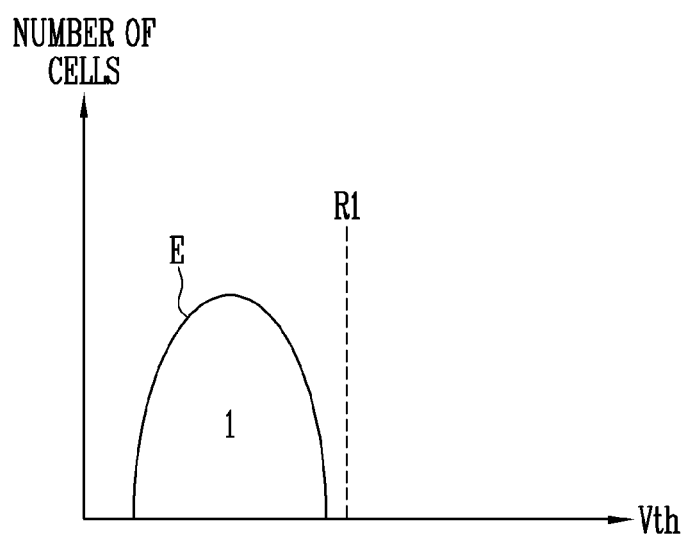
FIG. 12B is a graph illustrating a threshold voltage distribution of memory cells included in the cell string shown in FIG. 12A.

FIG. 12A is a circuit diagram illustrating a cell string which becomes a monitoring target, and FIG. 12B is a graph illustrating a threshold voltage distribution of memory cells included in the cell string shown in FIG. 12A. An embodiment in which one cell string includes 8 memory cells is illustrated in FIG. 12A. That is, n becomes 8 in FIG. 12A.

Referring to FIG. 12A, a cell string corresponding to the qth column corresponding to a predetermined column position is illustrated as the cell string $CS_{MN}$ which becomes the monitoring target. The cell string $CS_{MN}$ includes a source select transistor SST, 8 memory cells $MC_{1q}$ to $MC_{8q}$, and a drain select transistor DST, which are sequentially connected between a common source line CSL and a bit line BL.

A gate of the source select transistor SST is connected to a source select line SSL, a gate of the 8 memory cells $MC_{1q}$ to $MC_{8q}$ are respectively connected to first to eighth word lines WL1 to WL8, and a gate of the drain select transistor DST is connected to a drain select line DSL.

As described above with reference to FIG. 11, even after a program operation on first to eighth pages PG1 to PG8 is performed, memory cells located on the qth column maintain the erase state E. That is, as shown in FIG. 12B, the 8 memory cells $MC_{1q}$ to $MC_{8q}$ included in the cell string $CS_{MN}$ which becomes the monitoring target all maintain the erase state.

Figure 13A:
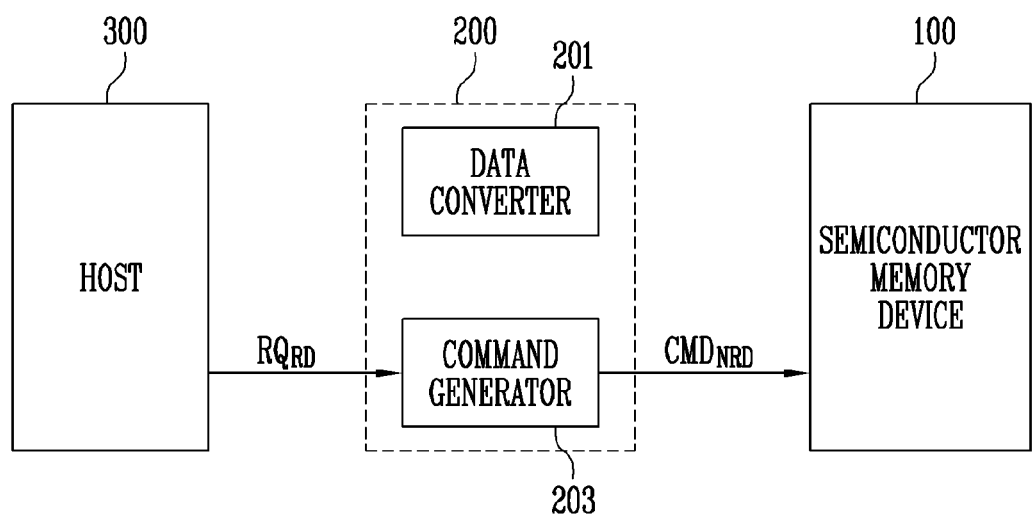
FIGS. 13A and 13B are diagrams illustrating a read operation of the semiconductor memory device according to a normal read command.
Figure 13B:
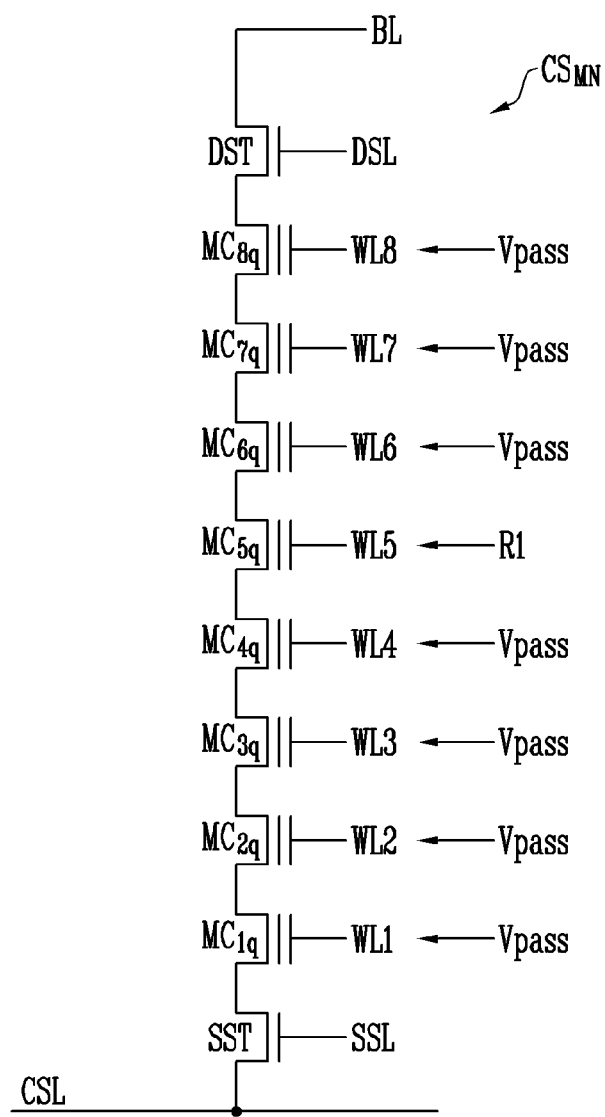

FIGS. 13A and 13B are diagrams illustrating a read operation of the semiconductor memory device 100 according to a normal read command.

Referring to FIG. 13A, a read request $RQ_{RD}$ for reading user data may be transferred from the host 300 to the controller 200. The command generator 203 of the controller 200 generates a normal read command $CMD_{NRD}$, based on the received read request $RQ_{RD}$. The normal read command $CMD_{NRD}$ may be a command for reading data stored in the semiconductor memory device 100. The controller 200 may transfer, to the semiconductor memory device, a block address indicating a memory block which includes a target page of the read operation, and a page address indicating the target page.

The semiconductor memory device 100 performs a normal read operation in response to the normal read command $CMD_{NRD}$. Referring to FIG. 13B, a fifth page has been selected as a page which becomes a target of the normal read operation. The semiconductor memory device 100 may apply the first read voltage R1 to the fifth word line connected to the selected fifth page, and apply a pass voltage Vpass to the other unselected word lines WL1 to WL4 and WL6 to WL8. Accordingly, data stored in memory cells included in the fifth page may be read, to be transferred to the controller 200.

Figure 14A:
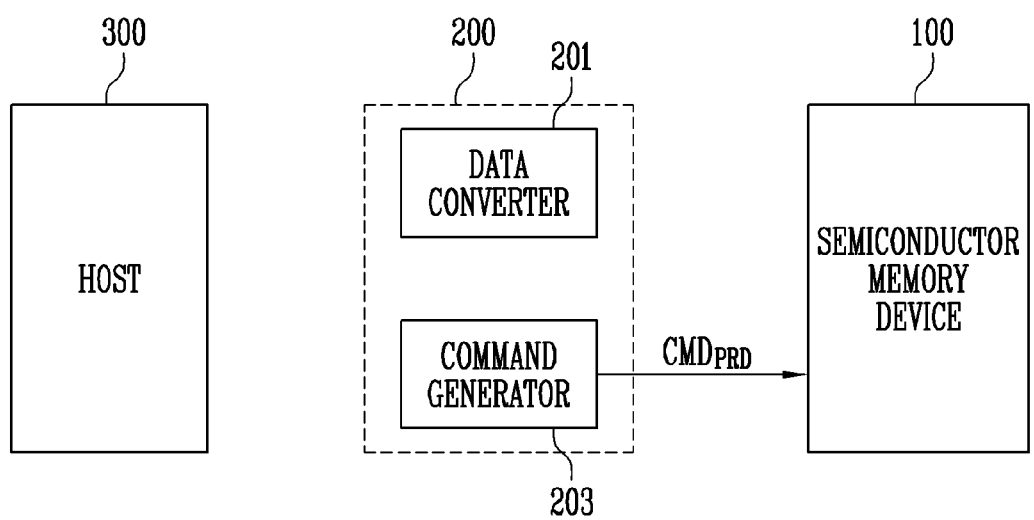
FIGS. 14A and 14B are diagrams illustrating a read operation of the semiconductor memory device according to a detection read command.
Figure 14B:
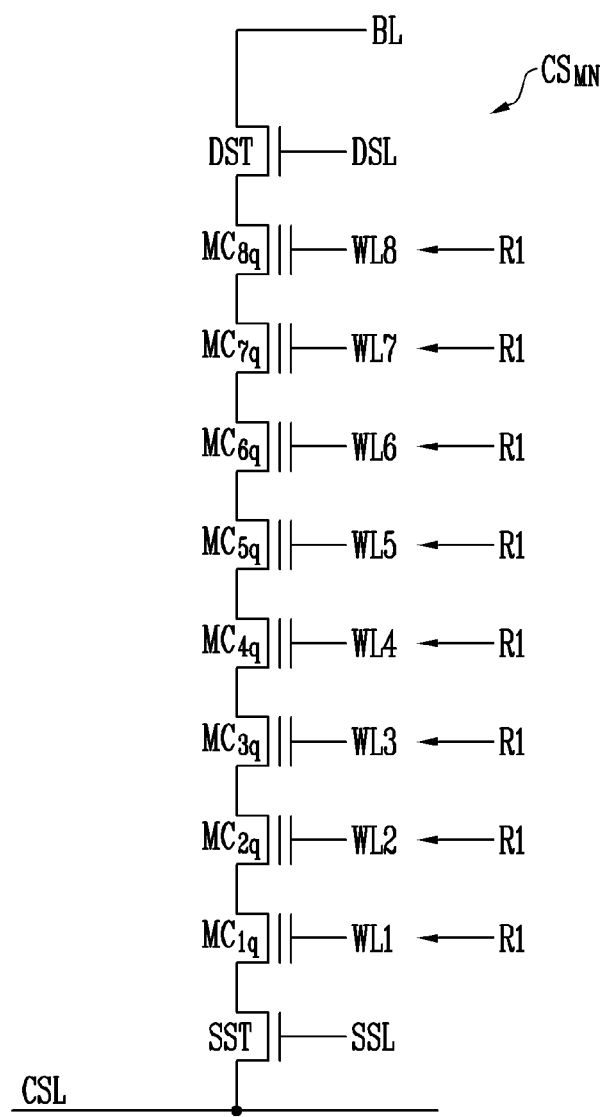

FIGS. 14A and 14B are diagrams illustrating a read operation of the semiconductor memory device 100 according to a detection read command.

Referring to FIG. 14A, in order to determine whether a threshold voltage distribution of a specific memory block in the semiconductor memory device 100 has been degraded, the controller 200 may determine that a detection read operation is to be performed. The detection read operation may be an operation for determining whether a threshold voltage distribution of memory cells in which data is stored has been degraded, rather than an operation for reading data stored in a memory block. To this end, the command generator 203 of the controller 200 generates a detection read command $CMD_{PRD}$. The controller 200 may transfer, to the semiconductor memory device 100, a block address indicating a memory block which becomes a target of the detection read operation. Unlike the normal read operation described with reference to FIG. 13A, a page address in the detection read operation might not be transferred to the semiconductor memory device 100.

The semiconductor memory device 100 performs the detection read operation in response to the detection read command $CMD_{PRD}$. Referring to FIG. 14B, the semiconductor memory device 100 may apply the first read voltage R1 to all the word lines WL1 to WL8 connected to the memory block which becomes the target of the detection read operation. In the detection read operation, data of memory cells included in the other cell strings except the cell string $CS_{MN}$ which becomes the monitoring target does not become an object of attention. That is, in accordance with the embodiment of the present disclosure, whether the threshold voltage distribution of the memory cells included in the memory block has been degraded is determined based on qth bit data corresponding to the cell string $CS_{MN}$ which becomes the monitoring target among data read by the detection read operation. A result of the detection read operation will be described later with reference to FIGS. 15A and 15B.

Figure 15A:
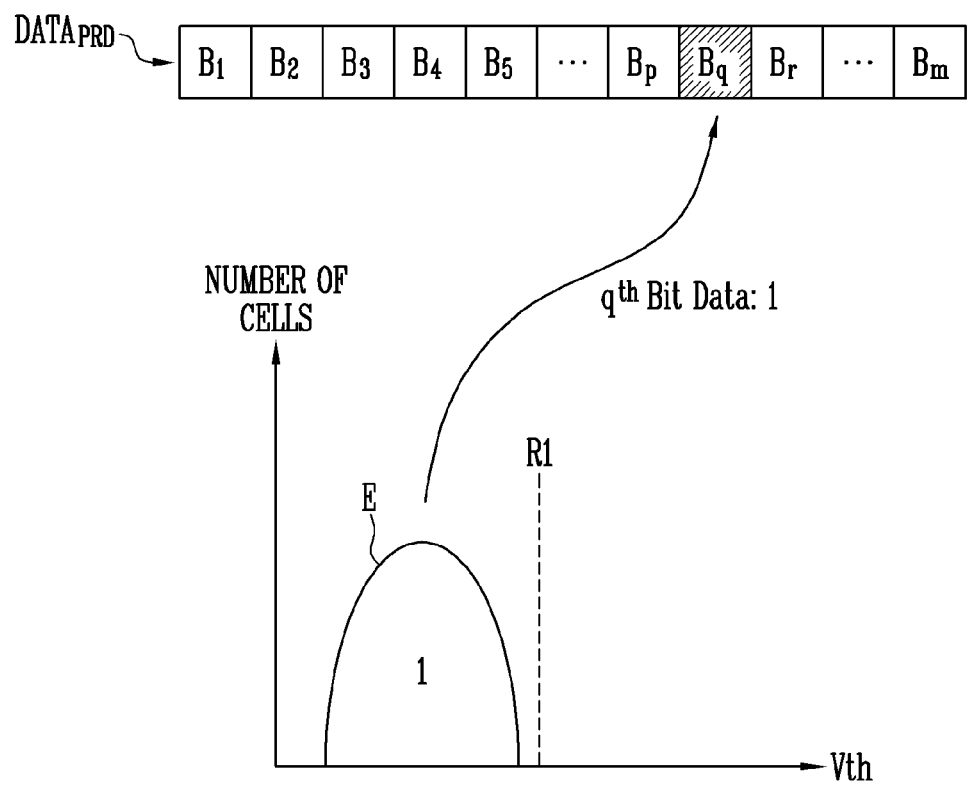
FIGS. 15A and 15B are diagrams illustrating bit data read from a cell string which becomes a monitoring target according to whether a threshold voltage distribution has been degraded.
Figure 15B:
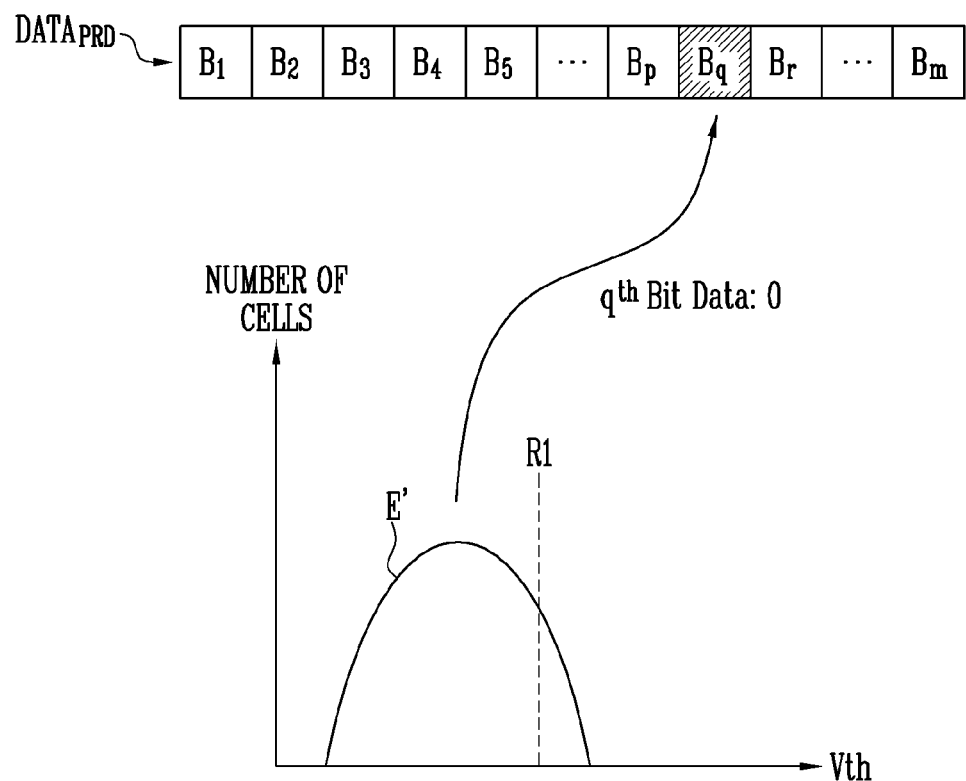

FIGS. 15A and 15B are diagrams illustrating bit data read from a cell string which becomes a monitoring target according to whether a threshold voltage distribution has been degraded.

Referring to FIG. 15A, data $DATA_{PRD}$ read by the detection read operation includes first to mth bits $B_1$ to $B_m$. The data $DATA_{PRD}$ read by the detection read operation is not obtained by reading data stored in a specific page. As shown in FIG. 14B, the data $DATA_{PRD}$ may be obtained by a read operation performed by applying the first read voltage R1 to all the word lines WL1 to WL8 connected to the selected memory block.

As described above, bit data of 1 has been programmed in all the memory cells located on the qth column, i.e., the memory cells MC1q to MC8q included in the cell string $CS_{MN}$ which becomes the monitoring target in the program operation. Therefore, when the memory cells have a satisfactory threshold voltage distribution state as shown in FIG. 15A, the memory cells MC1q to MC8q are all turned on when the first read voltage R1 is applied to the first to eight word lines WL1 to WL8 as shown in FIG. 14A. Accordingly, current flows through the bit line BL connected to the cell string $CS_{MN}$ which becomes the monitoring target in the detection read operation. Consequently, the data value of a qth bit Bq among bits included in the data DATAPRD read by the detection read operation becomes 1.

Meanwhile, referring to FIG. 15B, a threshold voltage distribution of some memory cells among the memory cells MC1q to MC8q included in the cell string CSMN which becomes the monitoring target has been degraded. That is, due to a right tail phenomenon, the threshold voltage distribution of the memory cells has been changed to a degraded erase state E'. Accordingly, a threshold voltage of some memory cells becomes higher than the first read voltage R1. Therefore, when the threshold voltage distribution state of the memory cells is degraded as shown in FIG. 15B, at least one memory cell among the memory cells MC1q to MC8q is turned off when the first read voltage R1 is applied to the first to eighth word lines WL1 to WL8 as shown in FIG. 14B. Accordingly, no current flows through the bit line BL connected to the cell string CSMN which becomes the monitoring target in the detection read operation. Consequently, the data value of the qth bit Bq among the bits included in the data DATAPRD read by the detection read operation becomes 0.

As illustrated in FIGS. 15A and 15B, the controller 200 may determine whether the threshold voltage distribution of the memory cells included in the selected memory block has been degraded according to the value of the qth bit $B_q$ among the bits included in the data $DATA_{PRD}$ read by the detection read operation. More specifically, the controller 200 may determine whether the right tail phenomenon has occurred, in which the threshold voltage distribution of the memory cells included in the selected memory block moves to the right according to the value of the qth bit $B_q$.

Figure 16:
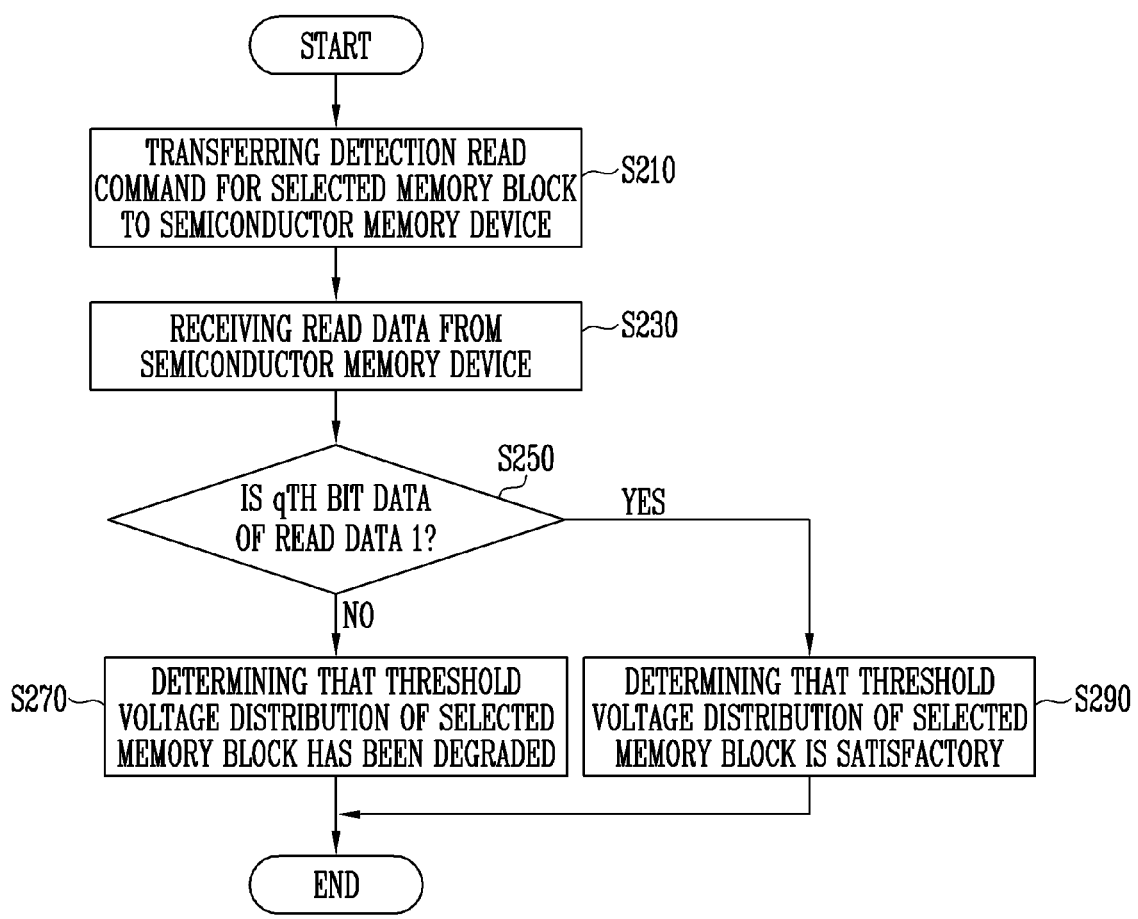
FIG. 16 is a flowchart illustrating an operating method of the controller in accordance with an embodiment of the present disclosure.

FIG. 16 is a flowchart illustrating an operating method of the controller 200 in accordance with an embodiment of the present disclosure.

Referring to FIG. 16, the operating method of the controller 200 includes step S210 of transferring a detection read command $CMD_{PRD}$ for a selected memory block to the semiconductor memory device 100, step S230 of receiving read data $DATA_{PRD}$ from the semiconductor memory device 100, and step S250 of determining whether qth bit data of the read data $DATA_{PRD}$ is 1.

As a determination result of the step S250, when the qth bit data of the read data $DATA_{PRD}$ is 1 (S250, YES), it can be seen that the threshold voltage distribution of the memory cells $MC_{1q}$ to $MC_{8q}$ included in the cell string $CS_{MN}$ which becomes the monitoring target satisfactorily maintains the erase state E as described with reference to FIG. 15A. Therefore, it may be determined that the threshold voltage distribution of the selected memory block is satisfactory (S290).

As a determination result of the step S250, when the qth bit data of the read data $DATA_{PRD}$ is 0 (S250, NO), it can be seen that the threshold voltage distribution of the memory cells $MC_{1q}$ to $MC_{8q}$ included in the cell string $CS_{MN}$ which becomes the monitoring target has been changed from the erase state E to the degraded erase state E' as described with reference to FIG. 15B. Therefore, it may be determined that the threshold voltage distribution of the selected memory block has been degraded (S270). Although not shown in FIG. 16, an operation of moving data stored in the selected memory block to another memory block may be further performed.

Figure 17:
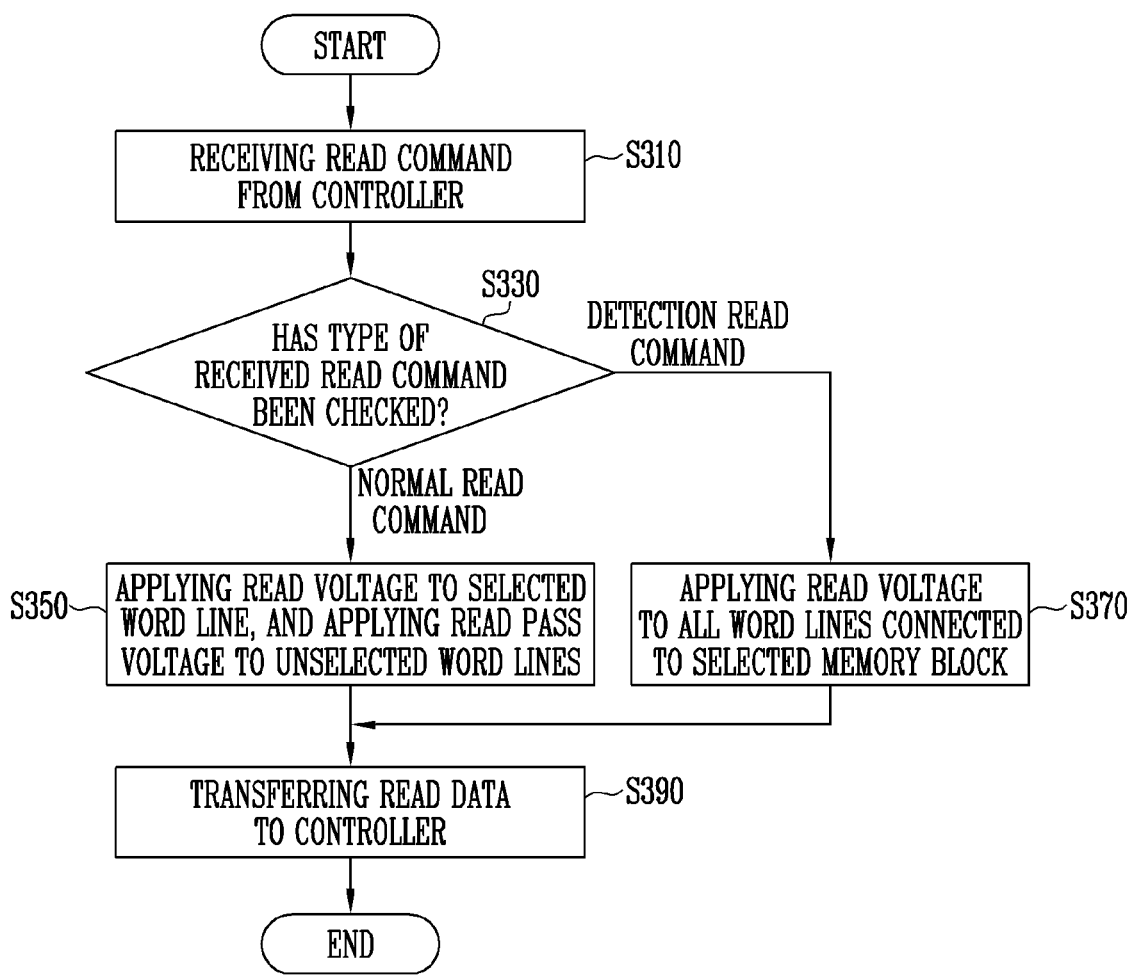
FIG. 17 is a flowchart illustrating an operating method of the semiconductor memory device in accordance with an embodiment of the present disclosure.

FIG. 17 is a flowchart illustrating an operating method of the semiconductor memory device in accordance with an embodiment of the present disclosure.

Referring to FIG. 17, the operating method of the semiconductor memory device 100 in accordance with the embodiment of the present disclosure includes step S310 of receiving a read command from the controller 200 and step S330 of checking a type of the received read command. The step S330 may be performed by the control logic 140 of the semiconductor memory device 100.

As a result obtained by performing the step S330, when the received read command is a normal read command, a normal read operation is performed by applying a read voltage to a selected word line and applying a read pass voltage to unselected word lines (S350), as shown in FIG. 13B. The step S350 may be performed by the peripheral circuit of the semiconductor memory device 100. Subsequently, the semiconductor memory device 100 transfers, to the controller 200, data read as a result obtained by performing the normal read operation (S390).

As a result obtained by performing the step S330, when the received read command is a detection read command, a detection read operation is performed by applying the read voltage to all word lines connected to a selected memory block (S370), as shown in FIG. 14B. The step S370 may be performed by the peripheral circuit of the semiconductor memory device 100. Subsequently, the semiconductor memory device 100 transfers, to the controller 200, data read as a result obtained by performing the detection read operation (S390).

Figure 18A:
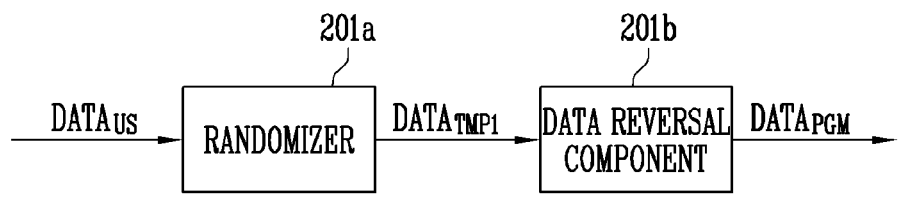
FIG. 18A is a block diagram illustrating an embodiment of a data converter shown in FIG. 7.
Figure 18B:
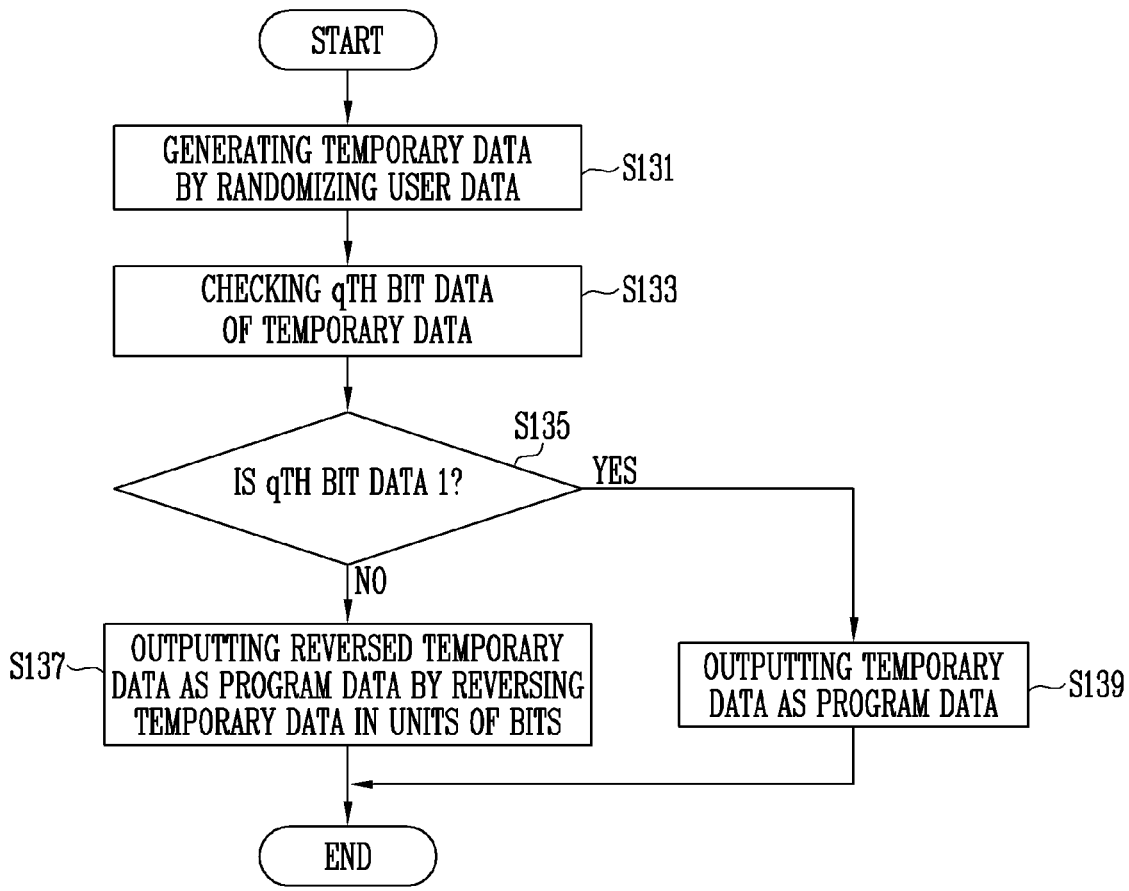
FIG. 18B is a flowchart illustrating an embodiment of step shown in FIG. 8.

FIG. 18A is a block diagram illustrating an embodiment of the data converter 201 shown in FIG. 7. FIG. 18B is a flowchart illustrating an embodiment of the step S130 shown in FIG. 8. Hereinafter, an embodiment in which the program data $DATA_{PGM}$ is generated from the user data $DATA_{US}$ will be described with reference to FIGS. 18A and 18B together.

Referring to FIG. 18A, the data converter 201 includes a randomizer 201a and a data reversal component 201b. The randomizer 201a generates temporary data $DATA_{TMP1}$ by randomizing received user data $DATA_{US}$ (S131). The temporary data $DATA_{TMP1}$ is transferred to the data reversal component 201b. The data reversal component 201b checks qth bit data among bit data included in the temporary data $DATA_{TMP1}$ (S133).

When the qth bit data is 1 (S135, YES), this is bit data for allowing the threshold voltage of the memory cell on the qth column to maintain the erase state according to the example shown in FIG. 9, and hence it is unnecessary to additionally manipulate the bit data. Therefore, the data reversal component 201b may output the temporary data $DATA_{TMP1}$ as program data $DATA_{PGM}$ (S139).

Meanwhile, when the qth bit data is 0 (S135, NO), this is bit data for allowing the threshold voltage of the memory cell on the qth column to be changed to the program state according to the example shown in FIG. 9, and hence it is necessary to change the bit data. Therefore, the data reversal component 201b may reverse the temporary data $DATA_{TMP1}$ in units of bits, and output the reversed temporary data as the program data $DATA_{PGM}$ (S137). Information on whether the temporary data has been reversed may be stored in the controller 200 or be stored in the semiconductor memory device 100.

Referring to FIGS. 18A and 18B, the data converter 201 may generate the program data $DATA_{PGM}$ for allowing the memory cell located on the predetermined column to maintain the erase state by converting the user data $DATA_{US}$ received from the host 300 (S130).

Figure 19A:
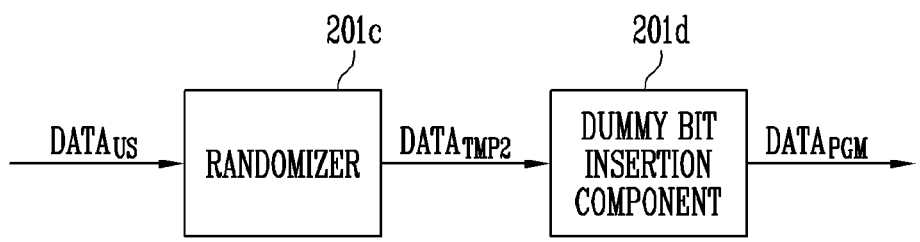
FIG. 19A is a block diagram illustrating another embodiment of the data converter shown in FIG. 7.
Figure 19B:
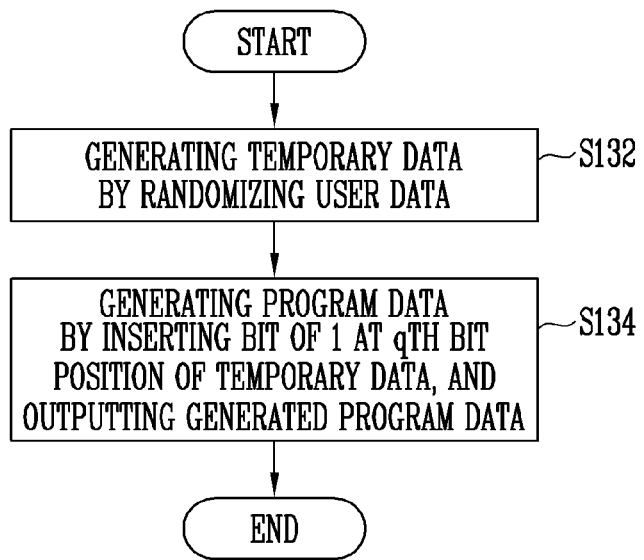
FIG. 19B is a flowchart illustrating another embodiment of the step shown in FIG. 8.
Figure 19C:
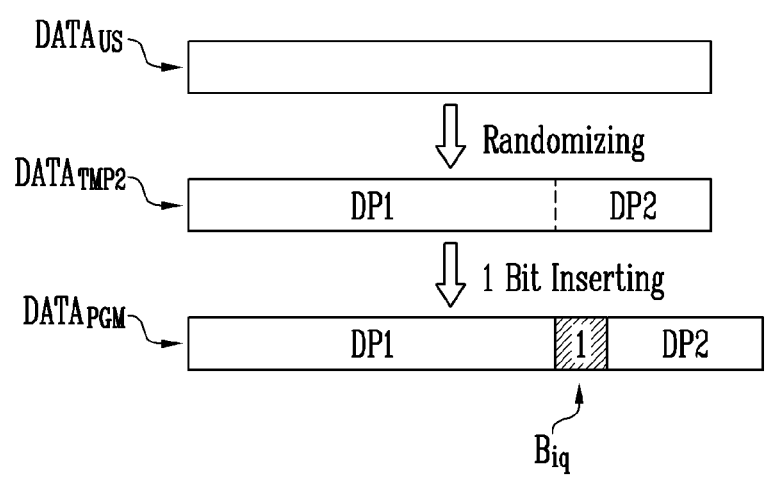
FIG. 19C is a diagram illustrating program data generated by a method shown in FIG. 19B.

FIG. 19A is a block diagram illustrating another embodiment of the data converter 201 shown in FIG. 7. FIG. 19B is a flowchart illustrating another embodiment of the step S130 shown in FIG. 8. FIG. 19C is a diagram illustrating program data generated by a method shown in FIG. 19B. Hereinafter, another embodiment in which the program data $DATA_{PGM}$ is generated from the user data $DATA_{US}$ will be described with reference to FIGS. 19A to 19C together.

Referring to FIG. 19A, the data converter 201 includes a randomizer 201c and a dummy bit insertion component 201d. The randomizer 201c generates temporary data $DATA_{TMP2}$ by randomizing received user data $DATA_{US}$ (S132). The temporary data $DATA_{TMP2}$ is transferred to the dummy bit insertion component 201d. The dummy bit insertion component 201d generates program data $DATA_{PGM}$ by inserting a bit of 1 at a qth bit position of the temporary data $DATA_{TMP2}$, and outputs the generated program data $DATA_{PGM}$ to the semiconductor memory device 100 (S134).

Referring to FIG. 19C, first, the temporary data $DATA_{TMP2}$ is generated from the user data $DATA_{US}$ through a data randomizing operation. The data randomizing operation is a technique widely known in the art, and therefore, its detailed description will be omitted. Through existing known various randomizing operations, the temporary data $DATA_{TMP2}$ shown in FIG. 19C may be generated.

The temporary data $DATA_{TMP2}$ may be divided into a first partial data DP1 and a second partial data DP2. The first partial data DP1 may include first to (q−1)th bits. Accordingly, the dummy bit insertion component 201d may generate the program data $DATA_{PGM}$ by inserting a data bit of 1 between the first partial data DP1 and the second partial data DP2. A qth bit $B_{iq}$ of the program data $DATA_{PGM}$ becomes the bit of 1, which is inserted by the dummy bit insertion component 201d. In accordance with the embodiment shown in FIGS. 19A and 19B, a length of the program data $DATA_{PGM}$ may be longer by at least one bit than that of the temporary data $DATA_{TMP2}$ or the user data $DATA_{US}$.

Figure 20A:
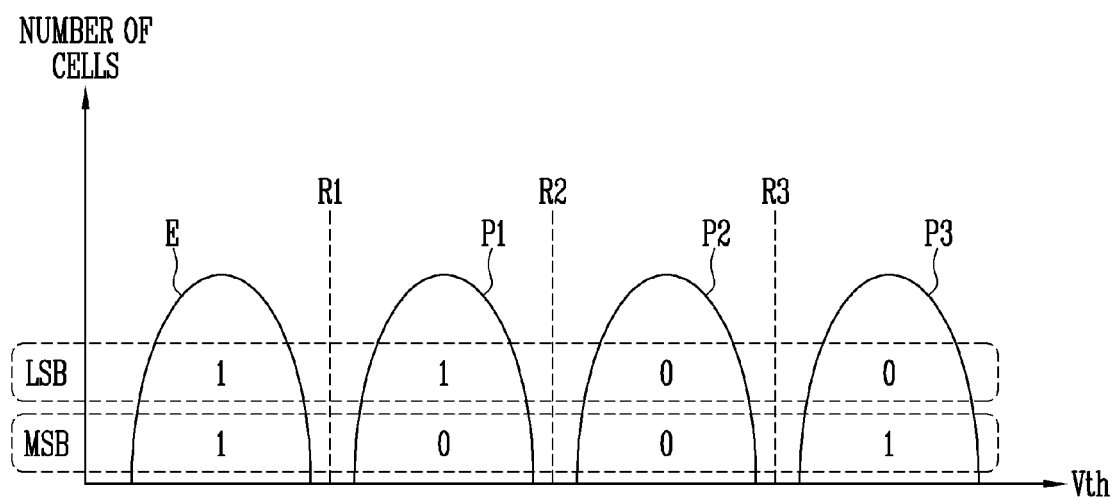
FIG. 20A is a graph illustrating a threshold voltage distribution of Multi-Level Cells (MLCs) of which a program operation is completed.
Figure 20B:
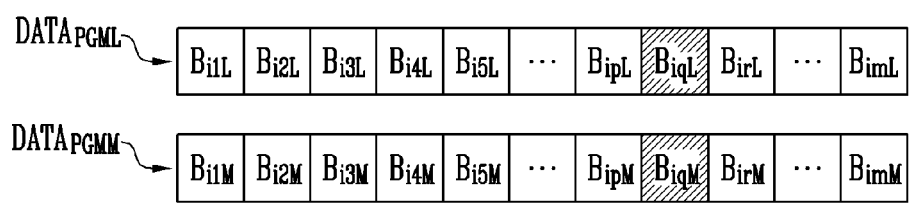
FIG. 20B is a diagram illustrating data programmed in a selected page by using an MLC scheme in accordance with an embodiment of the present disclosure.

FIG. 20A is a graph illustrating a threshold voltage distribution of Multi-Level Cells (MLCs) of which a program operation is completed. FIG. 20B is a diagram illustrating data programmed in a selected page by using an MLC scheme in accordance with an embodiment of the present disclosure.

Through FIGS. 9 to 19C, the operation of the semiconductor memory device and the controller in accordance with the present disclosure has been described with respect to the SLC. However, the present disclosure is not limited thereto, and may be applied to the MLCs or Triple-Level Cells (TLCs). Meanwhile, the present disclosure may also be applied to Quad-Level Cells (QLCs) and memory cells each storing 5-or-more-bit data.

Referring to FIG. 20A, a threshold voltage distribution of MLCs storing 2-bit data per memory cell is illustrated. The MLC has a threshold voltage corresponding to any one state among an erase state E, a first program state P1, a second program state P2, and a third program state P3. First to third read voltages R1 to R3 may be used to read data stored in the MLC.

Meanwhile, the MLC may store two bit data, i.e., Least Significant Bit (LSB) data and Most Significant Bit (MSB) data. According to a combination of the LSB and MSB data, memory cells have a threshold voltage corresponding to any one state of the erase state E, the first program state P1, the second program state P2, and the third program state P3. According to the example shown in FIG. 20A, when both the LSB data and the MSB data are 1, the threshold voltage of a memory cell corresponding thereto becomes the erase state E. Also, when the LSB data is 1 and the MSB data is 0, the threshold voltage of a memory cell corresponding thereto becomes the first program state P1. Meanwhile, when both the LSB data and the MSB data are 0, the threshold voltage of a memory cell corresponding thereto becomes the second program state P2. Finally, when the LSB data is 0 and the MSB data is 1, the threshold voltage of a memory cell corresponding thereto becomes the third program state P3.

Referring to FIG. 20B, two program data are stored in a selected page. That is, LSB program data $DATA_{PGML}$ respectively corresponding to LSB data of memory cells and MSB program data $DATA_{PGMM}$ respectively corresponding to MSB data of the memory cells are stored in the selected page. The LSB program data $DATA_{PGML}$ includes m bit data $B_{i1L}$ to $B_{imL}$. The MSB program data $DATA_{PGMM}$ also includes m bit data $B_{i1M}$ to $B_{imM}$.

By a combination of qth bit data $B_{iqL}$ of the LSB program data $DATA_{PGML}$ and qth bit data $B_{iqM}$ of the MSB program data $DATA_{PGMM}$, the threshold voltage of a qth memory cell of the selected page may be maintained in the erase state E even after a program operation. According to the example shown in FIG. 20A, each of the qth bit data $B_{iqL}$ of the LSB program data $DATA_{PGML}$ and the qth bit data $B_{iqM}$ of the MSB program data $DATA_{PGMM}$ may be 1. In this manner, the present disclosure can be applied to the MLCs.

Figure 21:
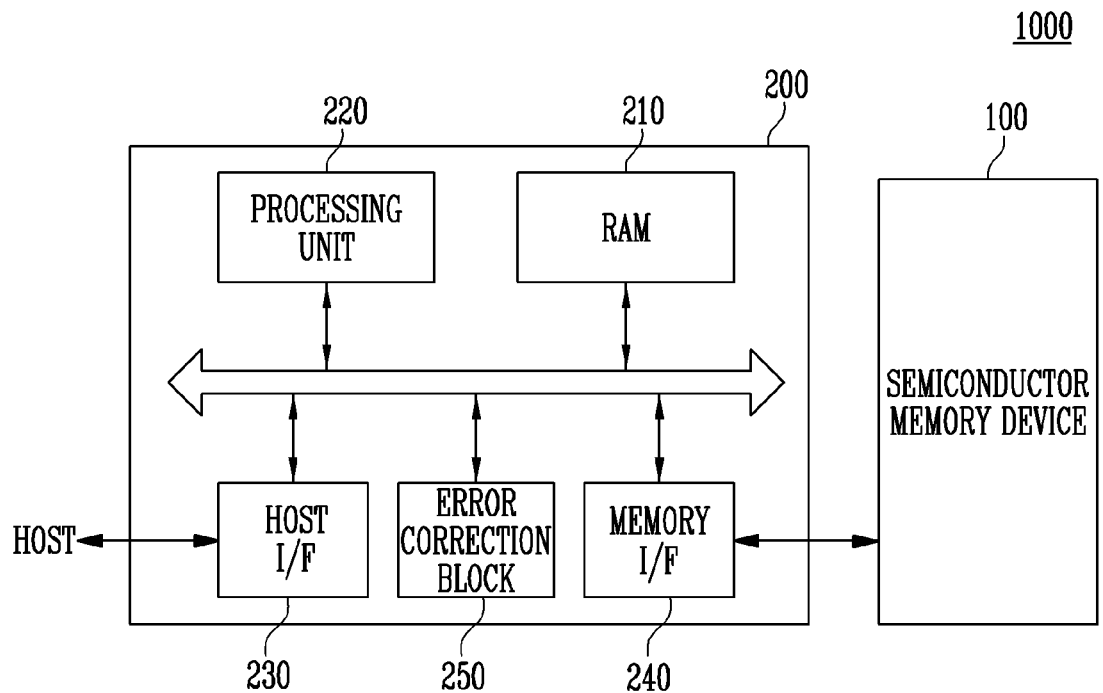
FIG. 21 is a block diagram illustrating an example of the controller shown in FIG. 1.

FIG. 21 is a block diagram illustrating an example of the controller 200 shown in FIG. 1.

Referring to FIG. 21, the controller 200 is connected to a semiconductor memory device 100 and a host HOST. The semiconductor memory device 100 may be the semiconductor memory device described with reference to FIG. 2. The controller 200 corresponds to the controller 200 shown in FIG. 1 or 7. Hereinafter, overlapping descriptions will be omitted.

The controller 200 accesses the semiconductor memory device 100 in response to a request from the host HOST. For example, the controller 200 controls read, write, erase, and background operations of the semiconductor memory device 100. The controller 200 provides an interface between the semiconductor memory device 100 and the host HOST. The controller 200 drives firmware for controlling the semiconductor memory device 100.

The controller 200 includes random access memory (RAM) 210, a processing unit 220, a host interface (I/F) 230, a memory interface (I/F) 240, and an error correction block 250. The RAM 210 is used as any one of working memory of the processing unit 220, cache memory between the semiconductor memory device 100 and the host HOST, and buffer memory between the semiconductor memory device 100 and the host HOST.

The processing unit 220 controls overall operations of the controller 200. The data converter 201 and the command generator 203, which are shown in FIG. 7, may be configured as firmware executed by the processing unit 220 shown in FIG. 21.

The host I/F 230 includes a protocol for exchanging data between the host HOST and the controller 200. In an embodiment, the controller 200 communicates with the host HOST through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The memory I/F 240 interfaces with the semiconductor memory device 100. For example, the memory I/F 240 may include a NAND interface or a NOR interface.

The error correction block 250 is configured to detect and correct an error of data received from the semiconductor memory device 100 by using an error correction code (ECC). The processing unit 220 may control the semiconductor memory device 100 to adjust a read voltage, based on an error detection result of the error correction block 250, and perform re-reading.

The controller 200 and the semiconductor memory device 100 may be integrated into one semiconductor device. In an embodiment, the controller 200 and the semiconductor memory device 100 may be integrated into one semiconductor device, to constitute a memory card. For example, the controller 200 and the semiconductor memory device 100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 200 and the semiconductor memory device 100 may be integrated into one semiconductor device to constitute a semiconductor drive (solid state drive (SSD)). The semiconductor drive SSD includes a memory system 1000 configured to store data in a semiconductor memory. When the memory system 1000 including the controller 200 and the semiconductor memory device 100 is used as the semiconductor drive SSD, the operating speed of the host HOST connected to the memory system 1000 can be remarkably improved.

In another example, the memory system 1000 including the controller 200 and the semiconductor memory device 100 may be implemented as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 and the memory system including the same may be packaged in various forms. For example, the semiconductor memory device 100 or the memory system may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 22:
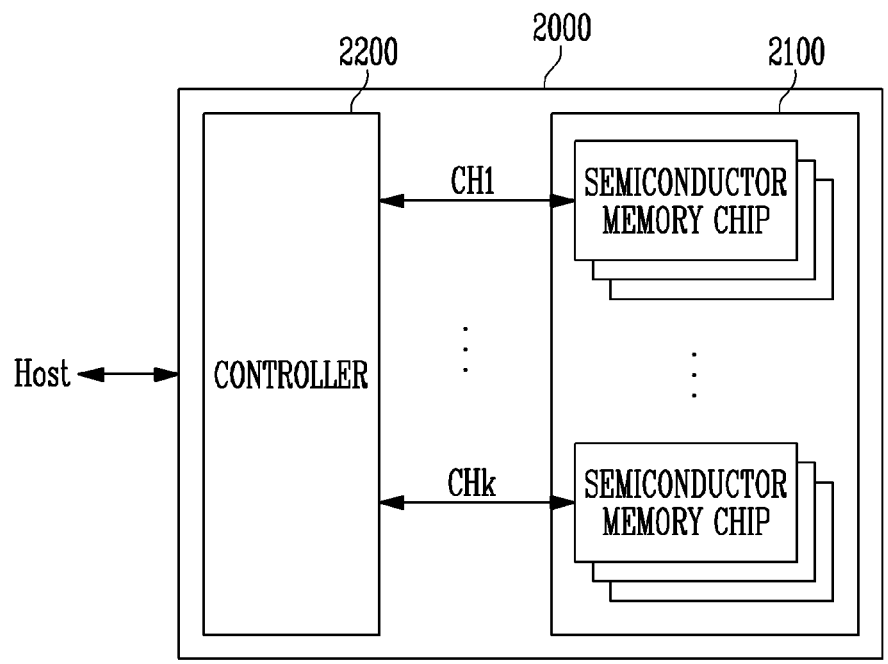
FIG. 22 is a block diagram illustrating an application example of a memory system shown in FIG. 21.

FIG. 22 is a block diagram illustrating an application example of the memory system shown in FIG. 21.

Referring to FIG. 22, a memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 22, there is illustrated a case where the plurality of groups communicate with the controller 2200 through first to kth channels CH1 to CHk. Each semiconductor memory chip may be configured and operated identically to the semiconductor memory device 100 described with reference to FIG. 2.

Each group communicates with the controller 2200 through one common channel. The controller 2200 is configured identically to the controller 200 described with reference to FIG. 21, and controls the plurality of memory chips of the semiconductor memory device 2100 through the plurality of channels CH1 to CHk.

Figure 23:
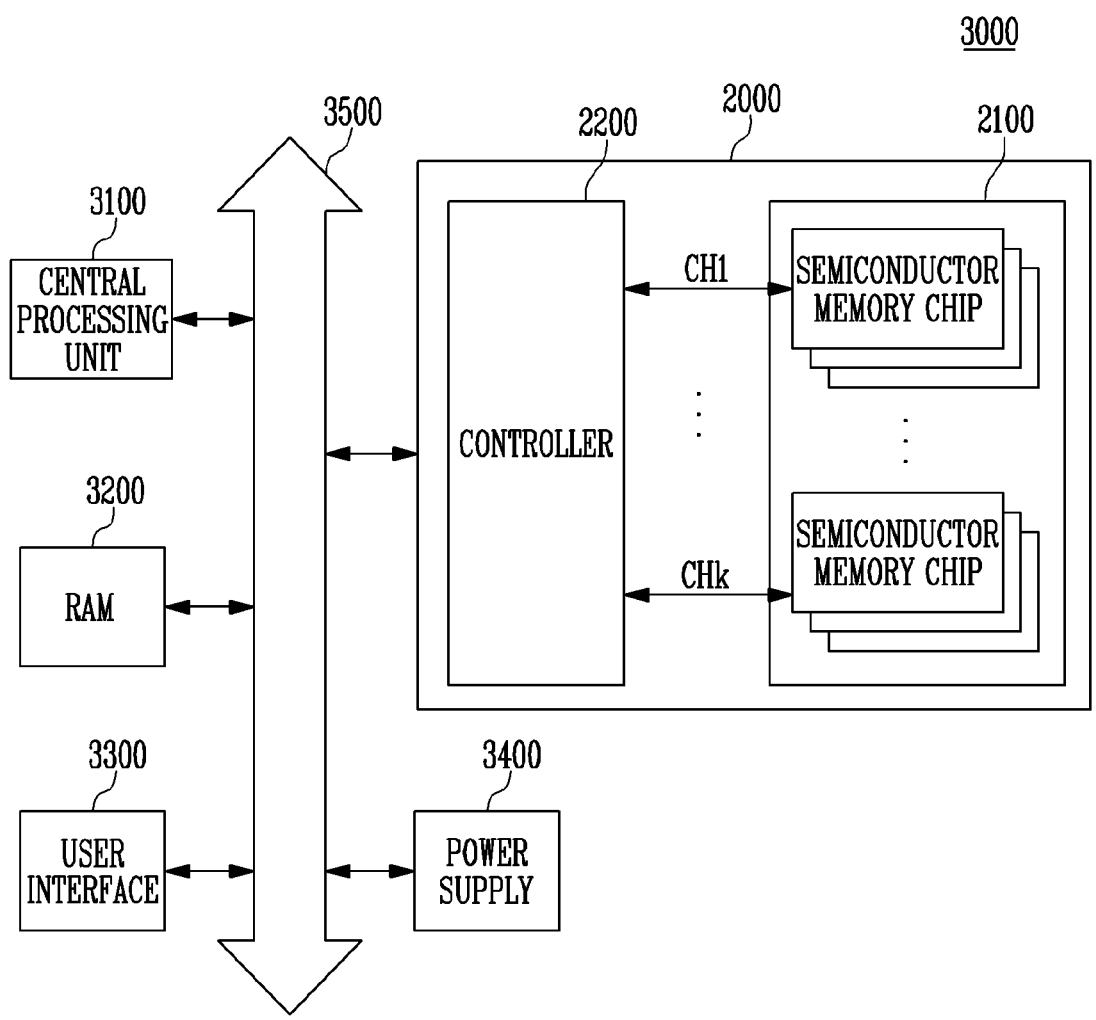
FIG. 23 is a block diagram illustrating a computing system including the memory system described with reference to FIG. 22.

FIG. 23 is a block diagram illustrating a computing system 3000 including the memory system described with reference to FIG. 22.

Referring to FIG. 23, the computing system 3000 includes a central processing unit 3100, RAM 3200, a user interface 3300, a power supply 3400, a system bus 3500, and a memory system 2000.

The memory system 2000 is electrically connected to the central processing unit 3100, the RAM 3200, the user interface 3300, and the power supply 3400 through the system bus 3500. Data supplied through user interface 3300 or data processed by the central processing unit 3100 are stored in the memory system 2000.

In FIG. 23, there is illustrated a case where the semiconductor memory device 2100 is connected to the system bus 3500 through the controller 2200. However, the semiconductor memory device 2100 may be directly connected to the system bus 3500. The function of the controller 2200 may be performed by the central processing unit 3100 and the RAM 3200.

In FIG. 23, there is illustrated a case where the memory system 2000 described with reference to FIG. 22 is provided. However, the memory system 2000 may be replaced by the memory system including the controller 200 and the semiconductor memory device 100, which is described with reference to FIG. 21.

In accordance with an embodiment of the present disclosure is a semiconductor memory device capable of rapidly checking whether a threshold voltage distribution of a memory block in which data is stored has been degraded.

Also, in accordance with an embodiment of the present disclosure is a controller capable of rapidly checking whether a threshold voltage distribution of a memory block in a semiconductor memory device has been degraded.

While the present disclosure has been shown and described with reference to certain embodiments thereof, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, embodiments of the present disclosure have been illustrated and described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. An operating method of a controller for controlling a semiconductor memory device including a plurality of memory cells, the method comprising:
generating program data to be stored in a selected page of the semiconductor memory device; and
controlling the semiconductor memory device to program the program data in the selected page,
wherein a threshold voltage of a memory cell located on a predetermined column maintains an erase state after program operation is complete, according to bit data at a predetermined position corresponding to the predetermined column in the program data.

2. The method of claim 1, wherein the program data is generated from user data received from a host.

3. The method of claim 1, wherein bit data corresponding to the memory cell located on the predetermined position in the program data is 1.

4. The method of claim 3, further comprising:
  transferring, to the semiconductor memory device, a detection read command for a selected memory block including the selected page;
  receiving read data from the semiconductor memory device; and
  determining whether bit data at a predetermined position in the read data is 1.

5. The method of claim 4, further comprising determining that a threshold voltage distribution of memory cells included in the selected memory block is satisfactory, in response to a determination that the bit data at the predetermined position in the read data is 1.

6. The method of claim 4, further comprising determining that a threshold voltage distribution of memory cells included in the selected memory block has been degraded, in response to a determination that the bit data at the predetermined position in the read data is 0.

7. The method of claim 6, further comprising moving data stored in the selected memory block to another memory block.

8. An operating method of a semiconductor memory device including a plurality of memory blocks, the method comprising:
  receiving a read command from a controller;
  checking a type of the read command and obtaining a check result; and
  performing, based on the check result, a read operation corresponding to the read command on a selected memory block among the plurality of memory blocks,
  wherein, when the type of read command is a detection read command, performing the read operation includes applying a read voltage to a plurality of word lines connected to the selected memory block.

9. The method of claim 8, further comprising transferring, to the controller, read data obtained by performing the read operation.

10. A controller for controlling a semiconductor memory device including a plurality of memory cells, the controller comprising:
  a data converter configured to generate program data to be stored in a selected page of the semiconductor memory device, based on user data; and
  a command generator configured to generate a program command for controlling the semiconductor memory device to program the program data in the selected page,
  wherein a threshold voltage of a memory cell located on a predetermined column maintains an erase state after program operation is complete, according to bit data at a predetermined position corresponding to the predetermined column in the program data.

11. The controller of claim 10, wherein the data converter includes:
  a randomizer capable of generating temporary data by randomizing the user data; and
  a data reversal component capable of selectively reversing the temporary data, based on a bit at a predetermined position of the temporary data.

12. The controller of claim 11, wherein the data reversal component is capable of outputting, when the bit at the predetermined position of the temporary data is 1, the temporary data as the program data.

13. The controller of claim 11, wherein the data reversal component is capable of:
  reversing, when the bit at the predetermined position of the temporary data is 0, the temporary data in units of bits; and
  outputting, when the bit at the predetermined position of the temporary data is 0, the reversed temporary data as the program data.

14. The controller of claim 10, wherein the data converter includes:
  a randomizer capable of generating temporary data by randomizing the user data; and
  a dummy bit insertion component capable of inserting a dummy bit at a predetermined position of the temporary data.

15. The controller of claim 14, wherein the dummy bit insertion component is capable of inserting a bit of 1 at the predetermined position of the temporary data.

16. The controller of claim 10, wherein the command generator transfers, to the semiconductor memory device, a detection read command for a selected memory block including the selected page.

17. The controller of claim 16, wherein the controller is configured to determine whether a threshold voltage distribution of memory cells included in the selected memory block has been degraded, based on read data received corresponding to the detection read command.

18. The controller of claim 17, wherein the controller is configured to determine:
  when bit data at a predetermined position of the read data is 1, that the threshold voltage distribution of the memory cells included in the selected memory block is satisfactory; and
  when the bit data at the predetermined position of the read data is 0, that the threshold voltage distribution of the memory cells included in the selected memory block has been degraded.

* * * * *